(12) United States Patent
Chang et al.

(10) Patent No.: US 10,727,350 B2
(45) Date of Patent: Jul. 28, 2020

(54) MULTI-LAYER FILM DEVICE AND METHOD

(71) Applicant: Taiwan Semiconductor Manufacturing Company, Ltd., Hsinchu (TW)

(72) Inventors: Yao-Jen Chang, Taipei (TW); Chih-Chien Chi, Hsinchu (TW); Chen-Yuan Kao, Zhudong Township (TW); Hung-Wen Su, Jhubei (TW); Kai-Shiang Kuo, Hsinchu (TW); Po-Cheng Shih, Hsinchu (TW); Jun-Yi Ruan, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 16/047,624

(22) Filed: Jul. 27, 2018

(65) Prior Publication Data

US 2018/0350993 A1    Dec. 6, 2018

Related U.S. Application Data

(62) Division of application No. 15/226,233, filed on Aug. 2, 2016, now Pat. No. 10,199,500.

(51) Int. Cl.
*H01L 21/00* (2006.01)
*H01L 29/78* (2006.01)
(Continued)

(52) U.S. Cl.
CPC .... *H01L 29/7851* (2013.01); *H01L 21/76804* (2013.01); *H01L 21/76816* (2013.01); *H01L 21/823821* (2013.01); *H01L 23/528* (2013.01); *H01L 23/5226* (2013.01); *H01L 23/5329* (2013.01); *H01L 27/0924* (2013.01); *H01L 29/66545* (2013.01); *H01L 29/66795* (2013.01)

(58) Field of Classification Search
CPC ............ H01L 29/7851; H01L 23/5329; H01L 21/76816
See application file for complete search history.

(56) References Cited

U.S. PATENT DOCUMENTS 6,365,506 B1    4/2002  Chang et al.
6,399,486 B1    6/2002  Chen et al.
(Continued)

FOREIGN PATENT DOCUMENTS

CN    1391266 A    1/2003
CN    1767171 A    5/2006
(Continued)

*Primary Examiner* — Laura M Menz
(74) *Attorney, Agent, or Firm* — Slater Matsil, LLP

(57) ABSTRACT

A device, structure, and method are provided whereby an insert layer is utilized to provide additional support for weaker and softer dielectric layer. The insert layer may be applied between two weaker dielectric layers or the insert layer may be used with a single layer of dielectric material. Once formed, trenches and vias are formed within the composite layers, and the insert layer will help to provide support that will limit or eliminate undesired bending or other structural motions that could hamper subsequent process steps, such as filling the trenches and vias with conductive material.

20 Claims, 20 Drawing Sheets

(51) Int. Cl.
*H01L 29/66* (2006.01)
*H01L 23/522* (2006.01)
*H01L 23/528* (2006.01)
*H01L 21/768* (2006.01)
*H01L 23/532* (2006.01)
*H01L 21/8238* (2006.01)
*H01L 27/092* (2006.01)

(56) References Cited

U.S. PATENT DOCUMENTS

| | | | |
|---|---|---|---|
| 6,498,093 B1 | 12/2002 | Achuthan et al. | |
| 6,548,224 B1 | 4/2003 | Chen et al. | |
| 6,713,874 B1 | 3/2004 | Hopper et al. | |
| 6,756,321 B2 | 6/2004 | Ko et al. | |
| 6,806,192 B2 | 10/2004 | Lin et al. | |
| 6,890,850 B2 | 5/2005 | Lee et al. | |
| 7,232,762 B2 * | 6/2007 | Chang | H01L 21/0276 216/46 |
| 7,638,859 B2 | 12/2009 | Lu et al. | |
| 7,667,271 B2 | 2/2010 | Yu et al. | |
| 7,714,392 B2 * | 5/2010 | Chang | H01L 21/0276 257/369 |
| 7,741,222 B2 | 6/2010 | You et al. | |
| 7,898,037 B2 | 3/2011 | Chuang et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,502,649 B2 * | 11/2016 | Jang | H01L 45/1253 |
| 9,754,822 B1 | 9/2017 | Chou et al. | |
| 9,761,799 B2 * | 9/2017 | Huang | H01L 45/1253 |
| 9,812,363 B1 * | 11/2017 | Liao | H01L 29/785 |
| 10,038,095 B2 * | 7/2018 | Li | H01L 29/0653 |
| 10,522,408 B2 * | 12/2019 | Liao | H01L 21/823481 |
| 2003/0054115 A1 | 3/2003 | Albano et al. | |
| 2003/0129827 A1 * | 7/2003 | Lee | H01L 21/02126 438/629 |
| 2004/0147104 A1 | 7/2004 | Lin et al. | |
| 2005/0140029 A1 | 6/2005 | Li et al. | |
| 2005/0181395 A1 | 8/2005 | Anthony et al. | |
| 2005/0282395 A1 * | 12/2005 | Chang | H01L 21/0276 438/740 |
| 2006/0051958 A1 | 3/2006 | Ho | |
| 2006/0183259 A1 | 8/2006 | Lai et al. | |
| 2006/0199373 A1 | 9/2006 | Miyajima et al. | |
| 2006/0276027 A1 | 12/2006 | Lu et al. | |
| 2007/0205414 A1 * | 9/2007 | Chang | H01L 21/0276 257/69 |
| 2007/0232046 A1 | 10/2007 | Miyata et al. | |
| 2008/0258228 A1 | 10/2008 | Chuang et al. | |
| 2010/0055899 A1 | 3/2010 | Mayer et al. | |
| 2012/0043663 A1 | 2/2012 | Ko et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0175617 A1 | 6/2014 | Antonelli et al. | |
| 2014/0356549 A1 | 12/2014 | Varadarajan | |
| 2015/0235943 A1 | 8/2015 | Suzumura et al. | |
| 2016/0293484 A1 | 10/2016 | Lee et al. | |
| 2017/0110501 A1 * | 4/2017 | Hsu | H01L 27/14645 |
| 2019/0311955 A1 * | 10/2019 | Xu | H01L 27/0886 |

FOREIGN PATENT DOCUMENTS

| | | |
|---|---|---|
| CN | 1881558 A | 12/2006 |
| CN | 102214599 A | 10/2011 |
| CN | 103871963 A | 6/2014 |
| JP | 2006237349 A | 9/2006 |
| JP | 2006344965 A | 12/2006 |
| JP | 2009532866 A | 9/2009 |
| TW | I229412 B | 3/2005 |
| TW | 200522257 A | 7/2005 |
| TW | I238490 B | 8/2005 |
| TW | 200631092 A | 9/2006 |
| TW | I315558 B | 10/2009 |
| TW | 201145452 A | 12/2011 |
| TW | 201440123 A | 10/2014 |
| TW | I559990 B | 12/2016 |

\* cited by examiner

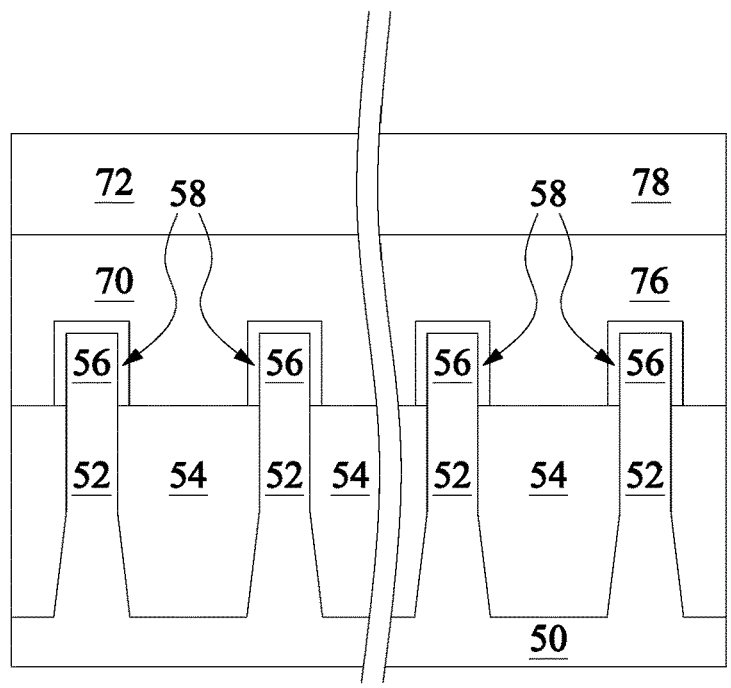
Fig. 19A
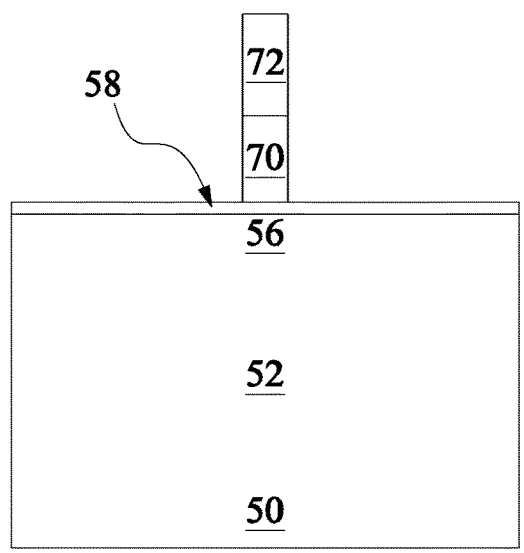 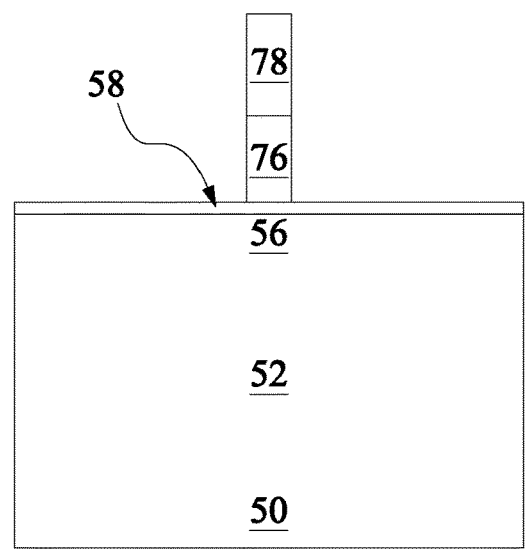
Fig. 19B               Fig. 19C

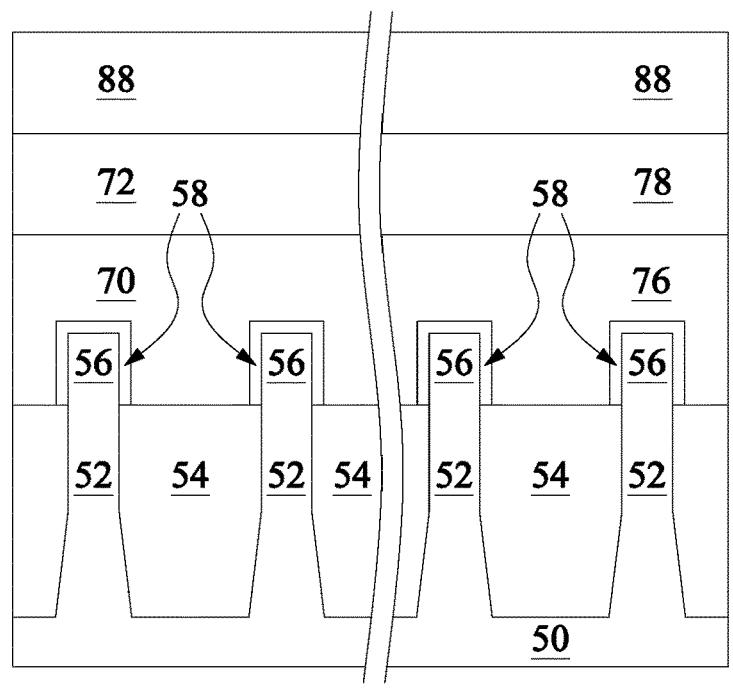
Fig. 22A
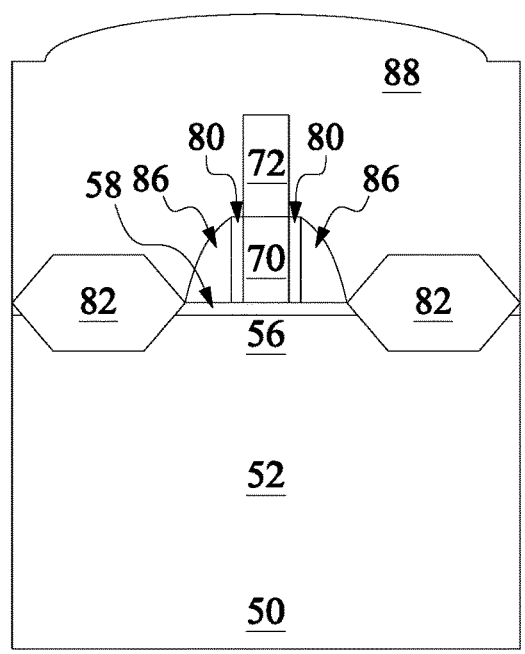 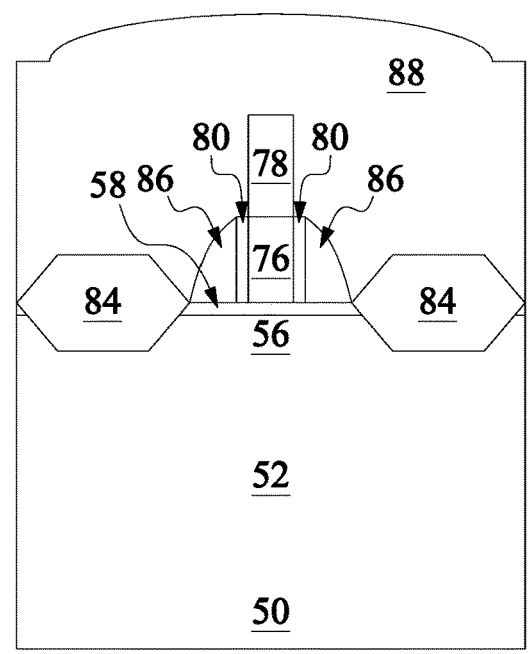
Fig. 22B          Fig. 22C

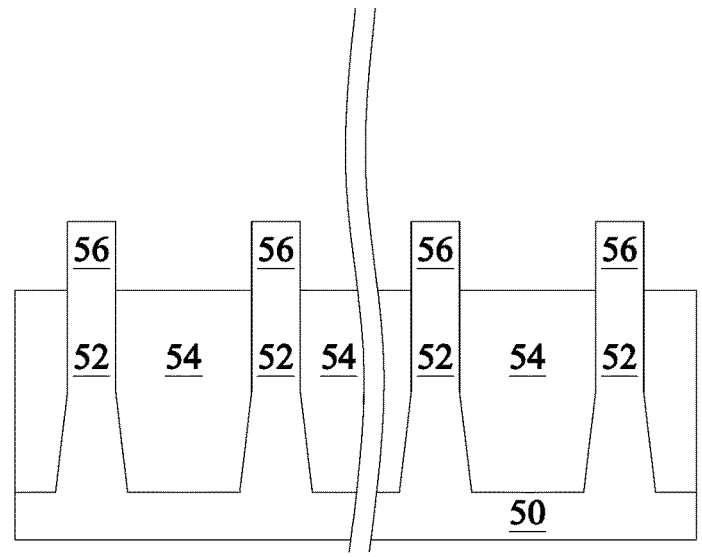
Fig. 24A
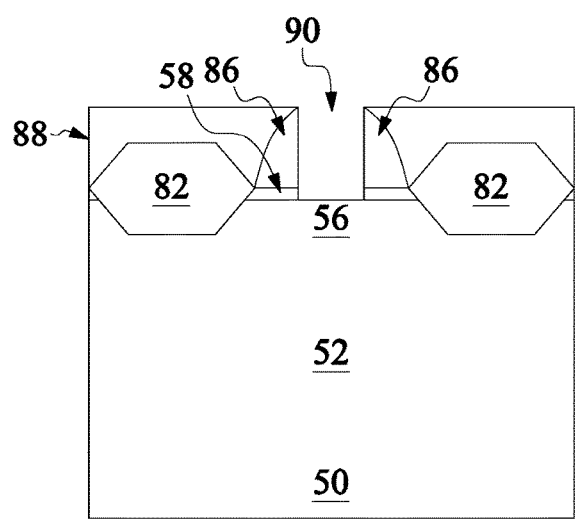 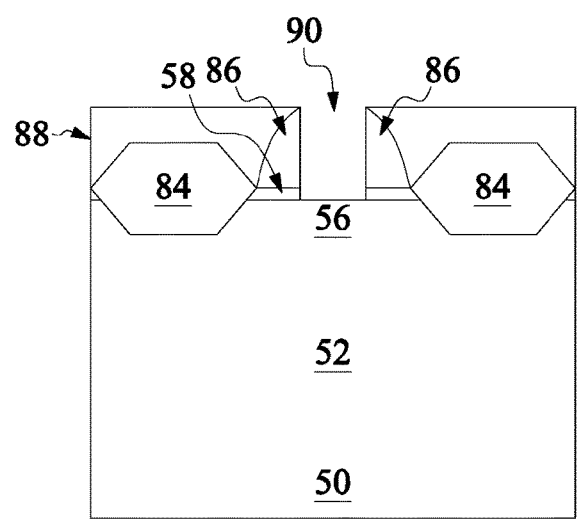
Fig. 24B          Fig. 24C

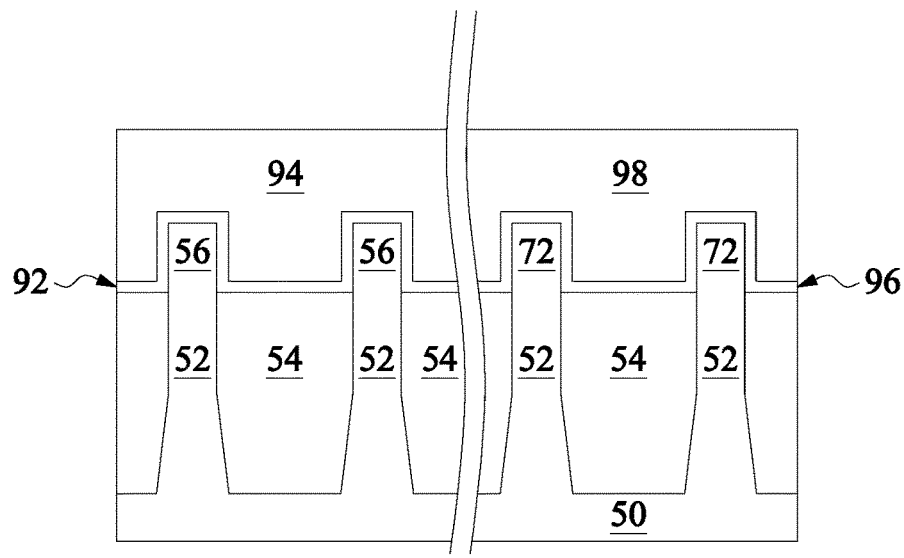
Fig. 25A
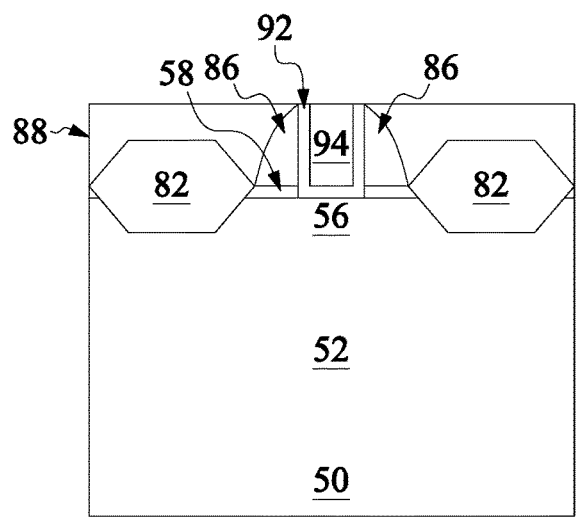 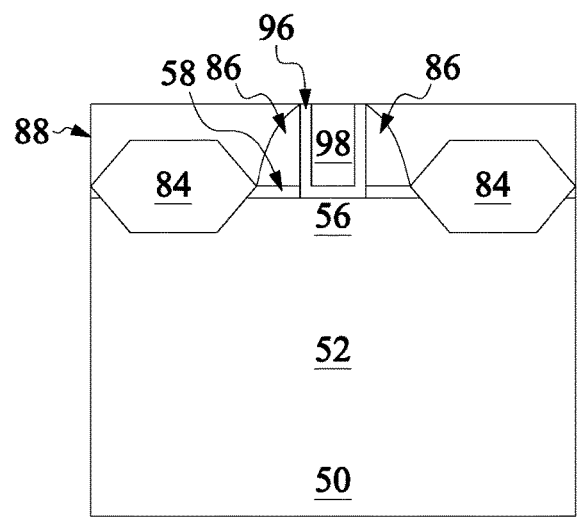
Fig. 25B          Fig. 25C

MULTI-LAYER FILM DEVICE AND METHOD

PRIORITY CLAIM AND CROSS-REFERENCE

This application is a divisional of U.S. application Ser. No. 15/226,233, entitled "Multi-Layer Film Device and Method," filed on Aug. 2, 2016, which application is hereby incorporated herein by reference.

BACKGROUND

In the current process of miniaturizing semiconductor devices, low-k dielectric materials are desired as the inter-metal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC).

However, the materials that are currently being considered or used as low-k dielectric materials are not ideal. In particular, in choosing a material based upon its k-value, and particularly based upon its low-k value, other characteristics, such as the hardness of the material or its strength, may not be ideal for use in a semiconductor manufacturing process. As such, improvements in processes that utilize low-k dielectric materials are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13-27C illustrate a process flow for utilizing the insert layer with finFET structures in accordance with some embodiments.

DETAILED DESCRIPTION

Figure 1:
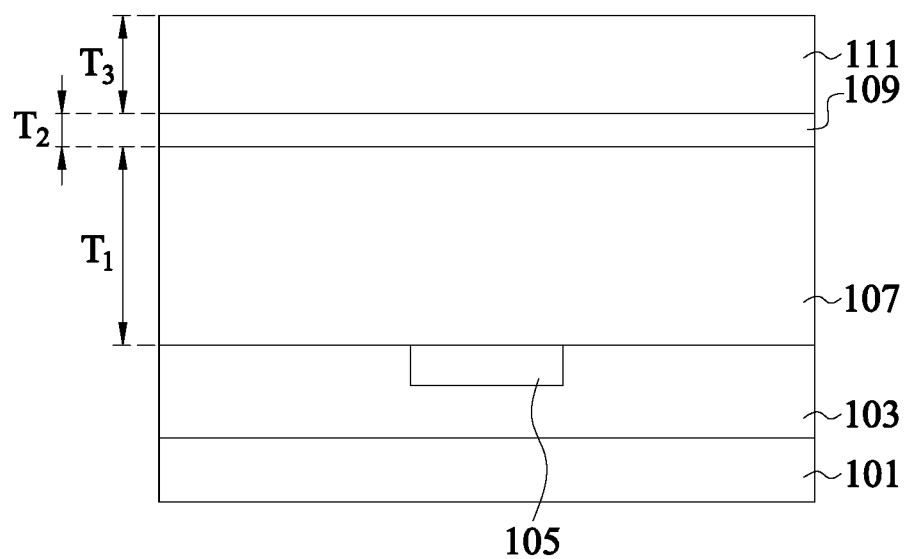
FIG. 1 illustrates a first dielectric layer, an insert layer, and a second dielectric layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, FIG. 1 illustrates a substrate 101 with active devices (not separately illustrated), metallization layers 103 over the substrate 101, a conductive element 105 within the metallization layers 103, a first dielectric layer 107, an insert layer 109, and a second dielectric layer 111. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the substrate 101.

The metallization layers 103 are formed over the substrate 101 and the active devices and are designed to connect the various active devices to form functional circuitry for the design. In an embodiment the metallization layers are formed of alternating layers of dielectric and conductive material and may be formed through any suitable process (such as deposition, damascene, dual damascene, etc.). In an embodiment there may be one to four layers of metallization separated from the substrate 101 by at least one interlayer dielectric layer (ILD), but the precise number of metallization layers is dependent upon the design.

The conductive element 105 may be formed in an upper portion of the metallization layers 103, and is a region to which an interconnect 401 (not illustrated in FIG. 1 but illustrated and described below with respect to FIG. 401) will make physical and electrical connection. In an embodiment the conductive element 105 may be a material such as copper formed using, e.g., a damascene or dual damascene process, whereby an opening is formed within an upper portion of the metallization layers 103, the opening is filled and/or overfilled with a conductive material such as copper, and a planarization process is performed to embed the conductive material within the metallization layers 103. However, any suitable material and any suitable process may be used to form the conductive element 105.

The first dielectric layer 107 may be formed in order to help isolate the interconnect 401 from other adjacent electrical routing lines. In an embodiment the first dielectric layer 107 may be, e.g., a low-k dielectric film intended to help isolate the interconnect 401 from other structures. By isolating the interconnect 401, the resistance-capacitance (RC) delay of the interconnect 401 may be reduced, thereby improving the overall efficiency and speed of electricity through the interconnect 401.

In an embodiment the first dielectric layer 107 may be a porous material such as SiOCN, SiCN or SiOC and may be formed by initially forming a precursor layer over the metallization layers 103. The precursor layer may comprise both a matrix material and a porogen interspersed within the matrix material, or may alternatively comprise the matrix material without the porogen. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the metallization layers 103, may also be utilized.

The precursor layer may be formed to a thickness sufficient to provide the isolation and routing characteristics that are desired of the first dielectric layer 107. In an embodiment, the precursor layer may be formed to a first thickness $T_1$ of between about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a chemical vapor deposition (CVD), physical vapor deposition (PVD), or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the first dielectric layer 107. The porogen may be a material that is big enough to form the pores while also remaining small enough such that the size of the individual pores does not overly displace the matrix material. As such, the porogen may comprise an organic molecule such as a methyl containing molecular or an ethyl containing molecule.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the first dielectric layer 107. For example, an anneal of between about 200° C. and about 500° C., such as about 400° C., for between about 10 seconds and about 600 seconds, such as about 200 seconds, may be utilized.

However, as one of ordinary skill in the art will recognize, the thermal process described above is not the only method that may be utilized to remove the porogen from the matrix material to form the first dielectric layer 107. Other suitable processes, such as irradiating the porogen with UV radiation to decompose the porogen or utilizing microwaves to decompose the porogen, may alternatively be utilized. These and any other suitable process to remove all or a portion of the porogen are all fully intended to be included within the scope of the embodiments.

However, the first dielectric layer 107 as described above does not have the desired resistance to withstand unbalanced stress that can occur during a patterning process. For example, trench openings that are located adjacent to a via opening may deform a different amount than a trench opening that is located further away from the via opening, such as by being the third trench opening removed from the via opening. In a particular example, each of the trench openings may be patterned with a process that attempts to form the trench openings to have a similar width, but because of the unbalanced forces within each opening, a trench opening adjacent to the via opening may have that desired width reduced by 4 nm to 5 nm or 6 nm as compared to the width achieved by a trench opening located away from the via opening. Such reductions and differences between the various trench openings could cause gap-filling problems in subsequent metallization processes (discussed further below).

As such, once the first dielectric layer 107 has been formed, the insert layer 109 is formed over the first dielectric layer 107 in order to provide a frame for additional structural support to increase the robustness of the first dielectric layer 107 and other subsequently deposited layers while impacting the capacitance less than simply changing the bulk film which would have a thickness of greater than 100 Å. In an embodiment the insert layer 109 is a material with a larger hardness and a higher K-value than the first dielectric layer 107. For example, in an embodiment in which the first dielectric layer 107 has a hardness of between about 1.5 GPa to about 3.0 GPa, such as about 2 GPa, the insert layer 109 may have a hardness of greater than about 8 GPa, such as between about 10 GPa and about 13 GPa, such as about 12 GPa. In other words, the insert layer 109 may have a hardness that is greater than the first dielectric layer 107 of at least 5 GPa. Similarly, in an embodiment in which the first dielectric layer 107 has a K-value of between about 2.3 and about 2.9, the insert layer 109 may have a K-value of greater than about 3.0.

In particular embodiments, the insert layer 109 may comprise a material such as $Si_xO_y$ (e.g., $SiO_2$), $Si_xO_y$ (e.g., $SiO_2$), $Si_xC_y$ (e.g., SiC), $Si_xN_y$ (e.g., $Si_3N_4$), $Si_xO_yH_z$ (e.g., SiOH*), and $Si_wO_xC_yH_z$ (e.g., $SiOCH_3$), combinations of these, or the like. In another embodiment the insert layer 109 may comprise one or more materials such as metal oxides or metal nitrides, such as aluminum nitride (AlN) or titanium oxide ($TiO_2$). However, any suitable material may be used to provide the additional structural support for the first dielectric layer 107.

In an embodiment the insert layer 109 may be formed using a deposition process such as chemical vapor deposition (CVD), atomic layer deposition (ALD), physical vapor deposition (PVD), or the like. In other embodiments, such as an embodiment in which $SiO_2$ if formed, an initial layer of a first material such as silicon may be deposited or formed, and then the layer may be treated with, e.g., oxygen in order to form the final material for the insert layer 109. Any suitable process may be used to form the insert layer 109. The insert layer 109 may be formed to a second thickness $T_2$ of between about 10 Å and about 100 Å, such as about 30 Å.

After the insert layer 109 has been formed to provide the additional support, the second dielectric layer 111 may be formed over the insert layer 109. In an embodiment the second dielectric layer 111 may be formed from a similar material and in a similar fashion as the first dielectric layer 107. For example, the second dielectric layer 111 may comprise a porous material such as SiOCN formed by initially placing a matrix material and a porogen and then removing the porogen. However, in other embodiments the second dielectric layer 111 may be a different material than the first dielectric layer 107. Any suitable combination of materials may be formed. In an embodiment the second dielectric layer 111 may be formed to a third thickness $T_3$ of between about 100 Å and about 600 Å, such as about 400 Å.

Figure 2:
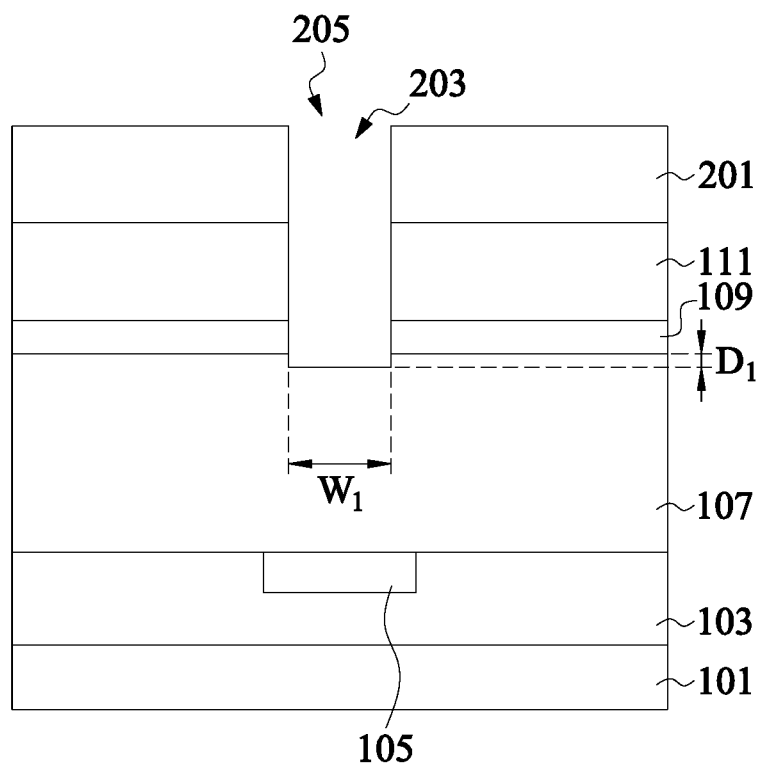
FIG. 2 illustrates a first opening formed in the second dielectric layer in accordance with some embodiments.

FIG. 2 illustrates the start of a patterning process to form the interconnects 401 within the first dielectric layer 107, the insert layer 109, and the second dielectric layer 111. In an embodiment the patterning process may be begun by initially applying a first photoresist 201, which may include an anti-reflective layer (ARL), on top of the second dielectric layer 111. Once in place, the first photoresist 201 may be exposed to a patterned energy source (e.g., light) in order to induce a chemical reaction in those portions of the first photoresist 201 that are impacted by the energy from the exposure. Once the chemical reaction has induced differences in the physical properties between the exposed and the non-exposed regions of the first photoresist 201, the first photoresist 201 is developed in order to remove either the exposed portion or the non-exposed portion of the first photoresist 201 and to form the pattern within the first photoresist 201 and expose an underlying portion of the second dielectric layer 111.

Once the first photoresist 201 has been placed and patterned, the pattern of the first photoresist 201 is transferred to the underlying second dielectric layer 111 to form a first opening 203 which, in some embodiments, will form an opening for a via. In an embodiment the pattern may be transferred using, e.g., an anisotropic first etching process (represented in FIG. 2 by the wavy line labeled 205) whereby reactants are directed at the portion of the second dielectric layer 111 that has been exposed through the first photoresist 201. In an embodiment the first etching process 205 of removing exposed material from the second dielectric layer 111 may be continued until the insert layer 109 has been exposed. The first opening 203 may have a first width $W_1$ at the top of the second dielectric layer 111 of between about 10 nm and about 50 nm, such as about 30 nm.

If desired, the first etching process 205 may be stopped after the insert layer 109 has been exposed. Alternatively, the first etching process 205 may be continued so as to remove either all of or a portion of the now exposed portion of the insert layer 109. In an embodiment in which the etchants that were utilized to etch the material of the second dielectric layer 111 are also suitable to etch the material of the insert layer 109, the first etching process 205 may simply be continued in order to continue the etch of the material of the insert layer 109. In another embodiment, different etchants or even a different etching process may be utilized in order to pattern the insert layer 109 once the insert layer 109 has been exposed. In an embodiment the first etching process 205 of removing exposed material from the insert layer 109 may be continued until the first dielectric layer 107 has been exposed.

If desired, the first etching process 205 may be stopped after the first dielectric layer 107 has been exposed. Alternatively, in an embodiment in which all of the exposed portion of the insert layer 109 is removed, the first opening 203 may be extended into the first dielectric layer 107. In an embodiment in which the etchants utilized to etch the insert layer 109 are suitable to etch the first dielectric layer 107, the first etching process 205 may simply be continued. In another embodiment the first etching process 205 may be modified to use different etchants or else a separate etching process may be utilized to etch the first dielectric layer 107. In a particular embodiment the first etching process 205 may be continued until the first opening 203 has a first depth $D_1$ within the first dielectric layer 107 of less than about 300 Å, such as about 50 Å.

Figure 3A:
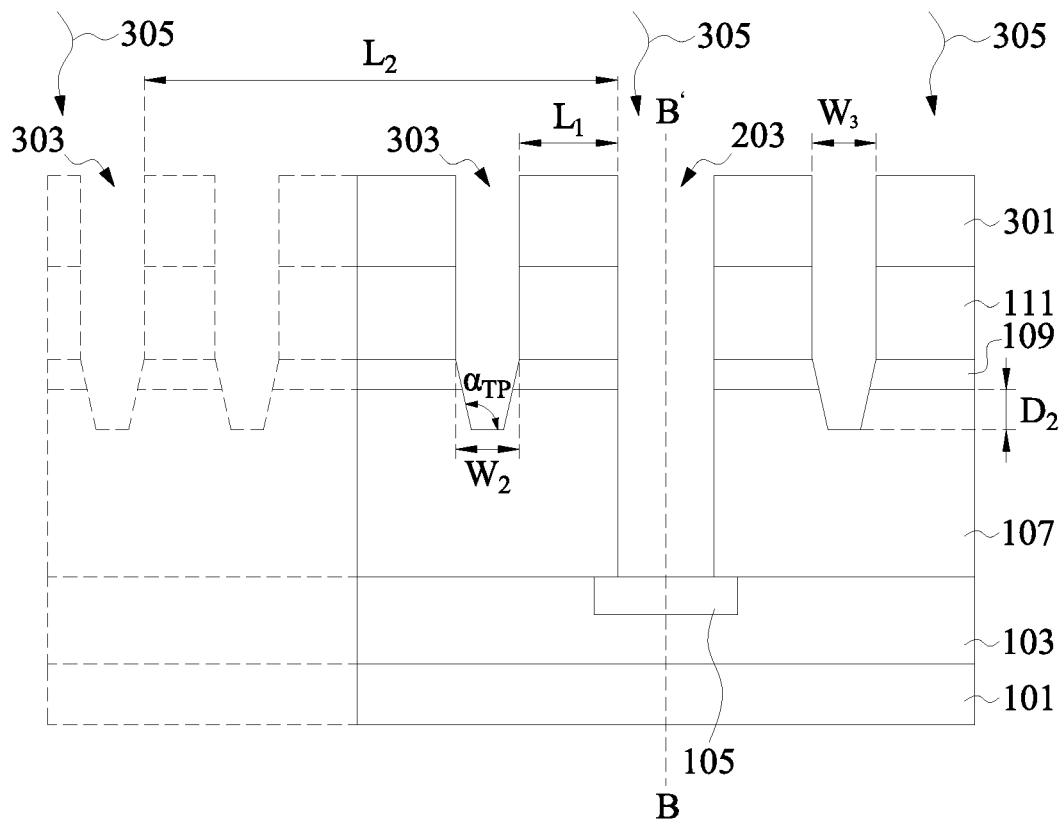
FIGS. 3A-3B illustrate second openings formed in the second dielectric layer in accordance with some embodiments.

FIG. 3A illustrates a removal of the first photoresist 201, a placement of a second photoresist 301, and a second etching process (represented in FIG. 3 by the wavy lines labeled 305) that may be used to both extend the first opening 203 to expose the conductive element 105 and also to form second openings 303, which in an embodiment may be a trench via. In an embodiment the first photoresist 201 may be removed using a process such as ashing, whereby the temperature of the first photoresist 201 is increased until the material of the first photoresist 201 undergoes a thermal decomposition, at which point it may be removed. However, any other suitable removal process, such as etching, may also be utilized.

Once the first photoresist 201 has been removed, the second photoresist 301 may be applied and patterned. In an embodiment the second photoresist 301 may be a similar material and may be patterned as described above with respect to the first photoresist 201. For example, the second photoresist 301 may be applied, exposed to an energy source (e.g., light), and developed in order to form the desired pattern. However, any suitable material or process for forming the second photoresist 301 may be used.

Once the second photoresist 301 has been patterned, the second etch process 305 is used to form the second openings 303 (which may be, e.g., openings for conductive trenches) and also to extend the first opening 203 (which may be, e.g., a via opening) to expose the conductive element 105. In an embodiment the second etch process 305 may be similar to the first etching process 205 described above with respect to FIG. 2 with respect to the first opening 203. For example, the second etching process 305 may be one or more anisotropic etches, such as one or more reactive ion etches, that extend the pattern of the second photoresist 301 through the second dielectric layer 111, the insert layer 109, and/or the first dielectric layer 107 to a second depth $D_2$ of less than about 200 Å, such as about 50 Å. However, any suitable etching process or process may alternatively be utilized.

Additionally, while the second etch process 305 is used to form the second openings 303, the second etch process 305 will also work to extend the first opening 203. In particular the second etch process 305 is utilized to extend the first opening 203 all of the way through the first dielectric layer 107 and expose the underlying conductive element 105. Such an exposure of the conductive element 105 allows a portion of the interconnects 401 to make physical and electrical contact with the conductive element 105.

However, whereas previous processes (which do not utilize the insert layer 109) resulted in unbalanced stresses from nearby via etching processes that resulted in a bending of the top opening of trenches adjacent to the via and caused critical dimension mismatch issues between trench openings at different locations around the device, the presence of the insert layer 109 will help to prevent the first dielectric layer 107 and the second dielectric layer 111 from bending or collapsing. As such, the top of the first openings 203 adjacent to the first opening 203 will better retain the desired shape, and second openings 303 across the device may have less variation. For example, whereas previous processes without the insert layer 109 may result in bending that could cause variations in widths between different second openings 303 (one located adjacent to a via opening and one located away from a via opening) of between about 5 nm to about 6 nm, such as about 5.5 nm (or greater than 10% of the desired pattern), the inclusion of the insert layer 109 may reduce the amount of bending at the top of the second openings 303, such that there may only be a variance between second openings 303 of 0.7 nm to 2.9 nm, such as about 1.7 or about 2 nm (or less than 5% of the desired pattern) in the desired width of the second openings 303, for a reduction in variance between differently located second openings 303 (e.g., located adjacent to a via opening by a first length $L_1$ of between about 5 nm and about 20 nm, such as about 10 nm, or located removed from a via opening (shown in dashed within FIG. 3A by a second length $L_2$ of between about 50 nm and about 200 nm, such as about 80 nm) of about 3 nm.

Additionally, the presence of the insert layer 109 will cause the second etching process 305 to form the second openings 303 (e.g., the trench openings) to have an angle between the bottom of the second openings 303 and a sidewall of the second openings 303. In an embodiment this angle, otherwise known as the trench profile angle $\alpha_{TP}$, may be between about 70° to about 80° (instead of a trench profile angle of between 80°-90° without the presence of the insert layer 109).

Figure 3B:
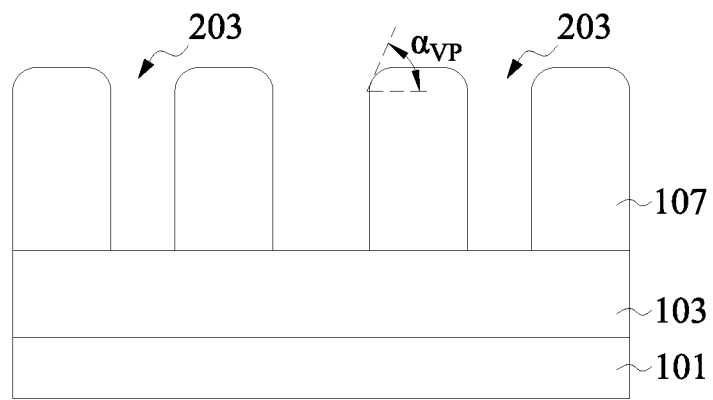

FIG. 3B illustrates a cross-section view of FIG. 3A along the dashed line in FIG. 3A labeled B-B' (an "along-line" view) after the second photoresist 301 has been removed. In an embodiment the second photoresist 301 may be removed using, e.g., an ashing process, although any suitable method may be used. Additionally, three first openings 203 may be viewed in FIG. 3B, and when the insert layer 109 is present and helps to provide additional structural support to the second dielectric layer 111 and prevent it from being disfigured during the patterning process, the first openings 203 may each have a via profile angle $\alpha_{VP}$ at the top of the first openings 203 to be between about 60° and about 70° (instead of a via profile angle 55°-65° that would occur without the insert layer 109).

Figure 4:
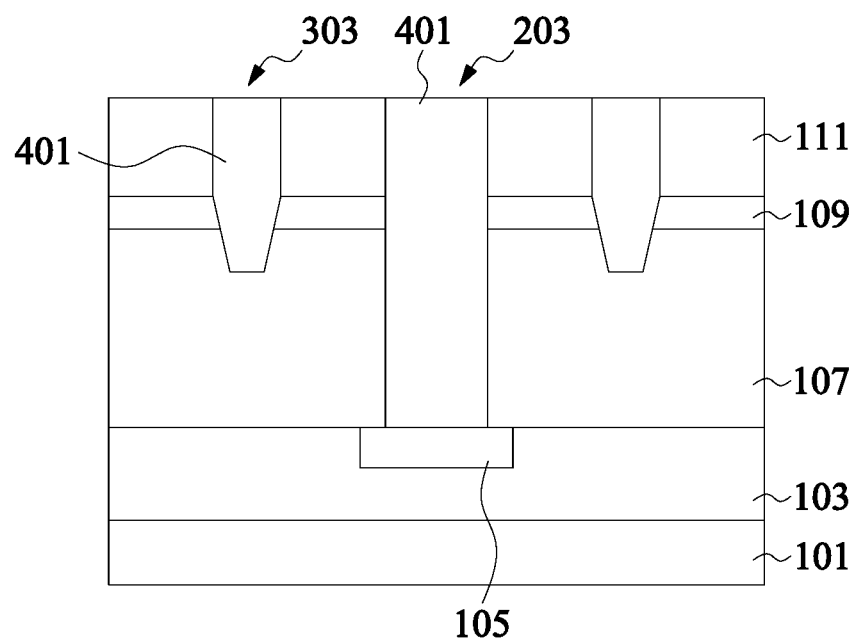
FIG. 4 illustrates a formation of an interconnect in accordance with some embodiments.

FIG. 4 illustrates a filling of the first opening 203 and the second openings 303 with a conductive material to form the interconnects 401. In an embodiment the interconnects 401 comprise vias (e.g., the conductive material within the first opening 203) as well as trenches (e.g., the conductive material within the second openings 303). However, any suitable combination of trenches and vias may be formed.

In an embodiment the first opening 203 and the second openings 303 may be filled with a barrier layer (not shown) and a conductive material to form the interconnects 401. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other processes, such as sputtering or metal organic chemical vapor deposition (MOCVD), may be used. The barrier layer is formed so as to contour to the underlying shape of the first opening 203 and the second openings 303.

The conductive material may comprise copper, although other suitable materials such as aluminum, alloys, doped polysilicon, combinations thereof, and the like, may alternatively be utilized. The conductive material may be formed by first depositing a seed layer (not separately illustrated in FIG. 4) and then electroplating copper onto the seed layer, filling and overfilling the first opening 203 and the second openings 303. Once the first opening 203 and the second openings 303 have been filled, excess barrier layer and excess conductive material outside of the first opening 203 and the second openings 303 are removed through a grinding process such as chemical mechanical polishing (CMP), although any suitable removal process may be used.

Additionally, while the above described process forms the first opening 203 prior to forming the second openings 303 in what may be described as a via-first dual damascene process, the embodiments are not limited to this approach. Rather, any suitable approach for forming the first opening 203 and second openings 303, such as by utilizing a trench first dual damascene process, a damascene process, or other suitable interconnect formation process, may also be utilized. All such processes are fully intended to be included within the scope of the embodiments.

By forming the insert layer 109 to provide additional support for the first dielectric layer 107 as well as the second dielectric layer 111, the disfiguration and bending that would normally occur during the patterning process may be mitigated or prevented. As such, the deleterious effects of these undesired disfigurations, such as variable reduced widths along a top of the second openings 303, may be prevented. Such preventions allow for fewer defects during the subsequent filling process.

Figure 5:
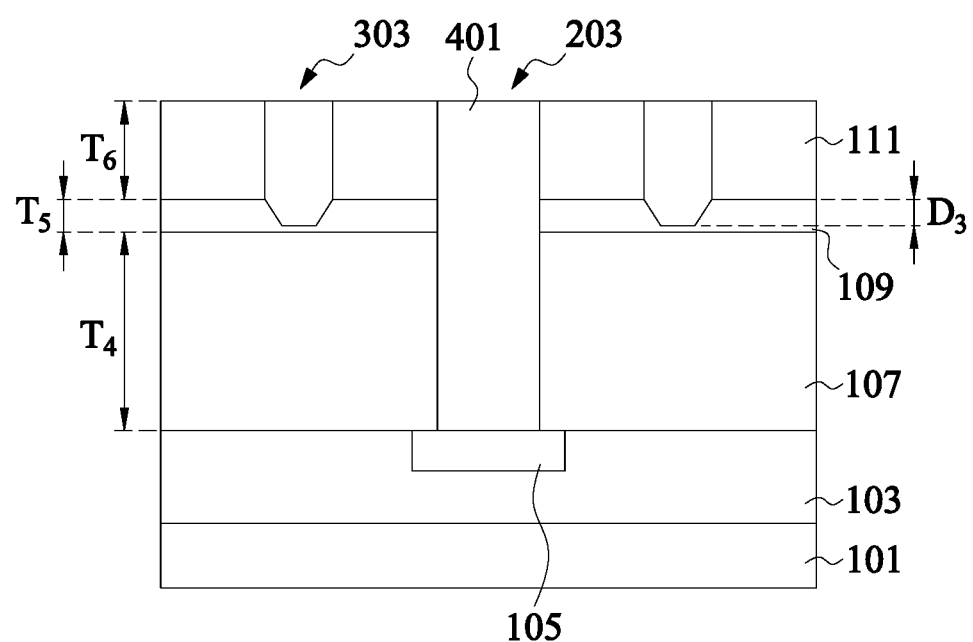
FIG. 5 illustrates an embodiment in which the second openings extend partially into the insert layer in accordance with some embodiments.

FIG. 5 illustrates another embodiment in which the insert layer 109 is placed between the first dielectric layer 107 and the second dielectric layer 111. In this embodiment, however, instead of the second openings 303 extending through the insert layer 109 and into the first dielectric layer 107 (as illustrated above with respect to FIG. 4), the second etching process 305 may be used to form the second openings 303 to extend only partially through the insert layer 109 and not to extend all of the way through the insert layer 109.

In this embodiment the first dielectric layer 107 may have a fourth thickness $T_4$ of between about 100 Å and about 700 Å, such as about 500 Å, the insert layer 109 may have a fifth thickness $T_5$ of between about 10 Å and about 100 Å, such as about 30 Å, and the second dielectric layer 111 may have a sixth thickness $T_6$ of between about 100 Å and about 500 Å, such as about 300 Å. In this embodiment the second etching process 305 may be used to form the second openings 303 to extend into the insert layer 109 a third depth $D_3$ of less than about 100 Å, such as about 50 Å.

Once the first opening 203 and the second openings 303 have been formed, the first opening 203 and the second openings 303 may be filled to form the interconnects 401. In an embodiment the interconnects 401 may be formed as described above with respect to FIG. 4. For example, a barrier layer and a seed layer may be deposited to line the first opening 203 and the second openings 303, and then the first opening 203 and second openings 303 may be filled with a conductive material such as copper, and a planarization process may be used to remove excess conductive material outside of the first opening 203 and the second openings 303. However, any suitable method and materials may be utilized to form the interconnects 401.

Figure 6A:
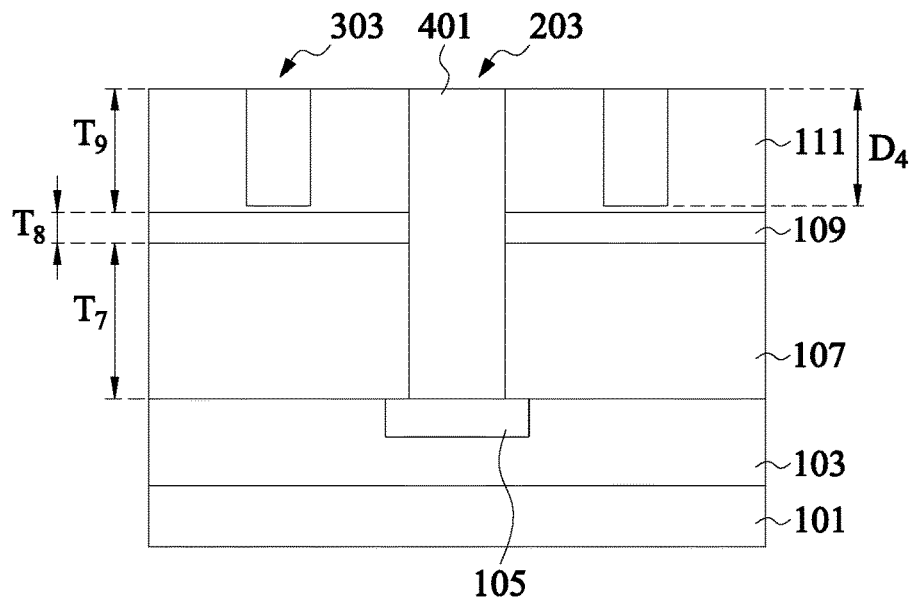
FIGS. 6A-6B illustrate an embodiment in which the second openings extend partially into the second dielectric layer in accordance with some embodiments.

FIG. 6A illustrates yet another embodiment in which the insert layer 109 is placed between the first dielectric layer 107 and the second dielectric layer 111. In this embodiment the second openings 303 do not extend to the insert layer 109 and remain solely within the second dielectric layer 111. In this embodiment the first dielectric layer 107 may have a seventh thickness $T_7$ of between about 100 Å and about 500 Å, such as about 300 Å, the insert layer 109 may have an eighth thickness $T_8$ of between about 10 Å and about 100 Å, such as about 30 Å, and the second dielectric layer 111 may have a ninth thickness $T_9$ of between about 100 Å and about 700 Å, such as about 500 Å. In this embodiment the second etching process 305 may be used to form the second openings 303 to extend into the second dielectric layer 111 a fourth depth $D_4$ of between about 100 Å and about 700 Å, such as about 500 Å.

Figure 6B:
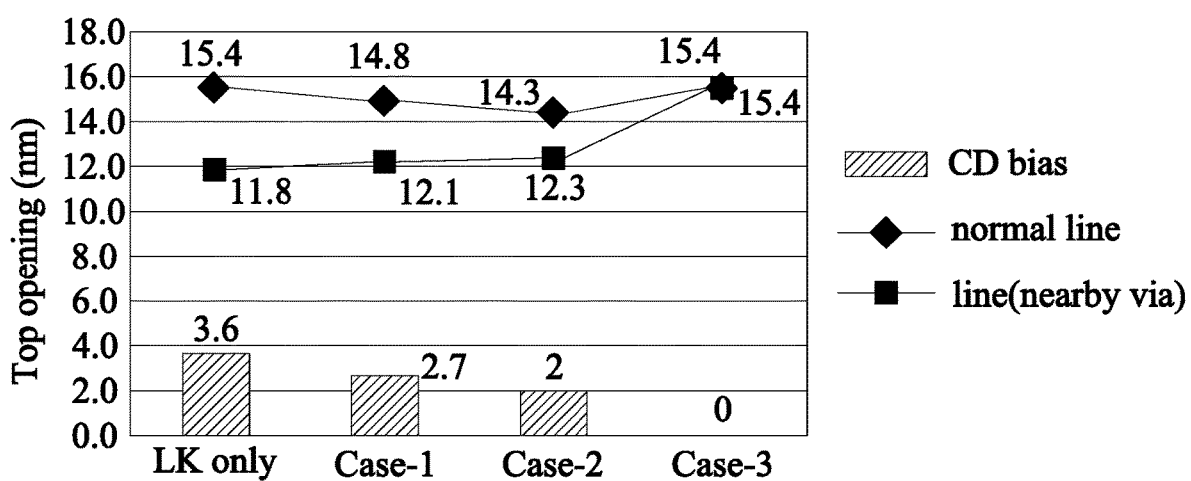

FIG. 6B illustrates a chart comparing the embodiment illustrated in FIG. 3A (labeled as "Case-1"), the embodiment illustrated in FIG. 5 (labeled as "Case-2"), and the embodiment illustrated in FIG. 6A (labeled as "Case-3") against a previous method which only used a single low-k dielectric (labeled "LK only"). In this embodiment the CD bias (the variance in widths between trench openings adjacent to a via opening (labeled "line(nearby via)") and trench openings not adjacent to a via opening (labeled "normal line") are illustrated by the boxes at the bottom of the graph, while the actual width of the top openings are charted for each of the cases. As can be seen, without the insert layer 109, a variance of 3.6 may be obtained, while the embodiment illustrated in FIG. 3A may achieve an improved variance about of 2.7, the embodiment illustrated in FIG. 5 may achieve an improved variance of about 2, and the embodiment illustrated in FIG. 6A may achieve a variance of about 0.

Figure 7:
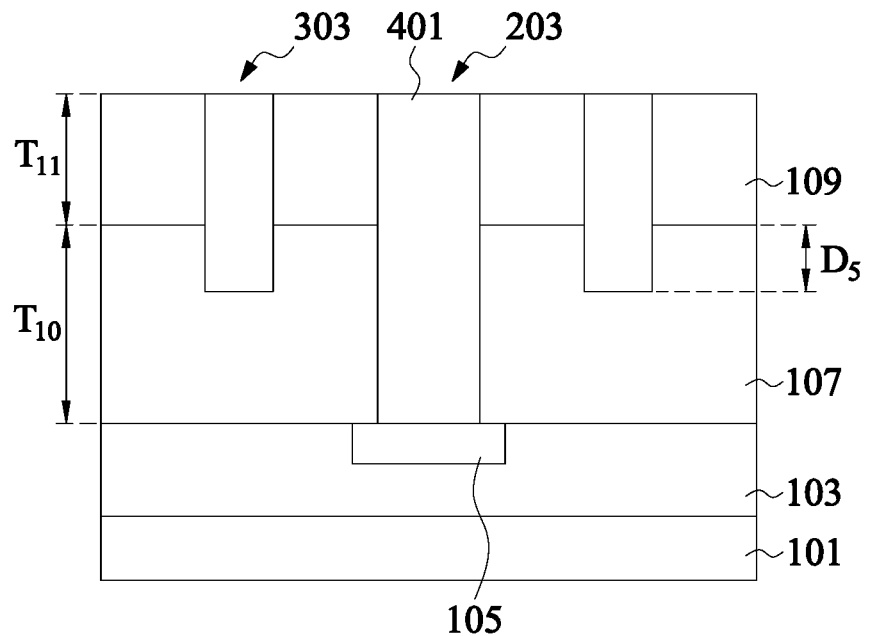
FIG. 7 illustrates an embodiment which includes the first dielectric layer and the insert layer and in which the second openings extend into the first dielectric layer in accordance with some embodiments.

FIG. 7 illustrates an embodiment in which the insert layer 109, instead of being placed between the first dielectric layer 107 and the second dielectric layer 111, replaces the second dielectric layer 111 such that the second dielectric layer 111 is not used. In this embodiment the first dielectric layer 107 may be formed with a tenth thickness $T_{10}$ of between about 100 Å and about 700 Å, such as about 500 Å, and the insert layer 109 may be formed to have an eleventh thickness $T_{11}$ of between about 100 Å and about 500 Å, such as about 300 Å. In this embodiment the second etching process 305 may be used to form the second openings 303 to extend all of the way through the insert layer 109 and will extend partially through the first dielectric layer 107. In an embodiment the second openings 303 will extend into the first dielectric layer 107 a fifth depth $D_5$ of less than about 300 Å, such as about 100 Å, and will have the trench profile angle $\alpha_{TP}$ of between about 70° to about 80°. Once formed, the first opening 203 and the second openings 303 may be filled with conductive material to form the interconnects 401, as described above with respect to FIG. 4.

Figure 8:
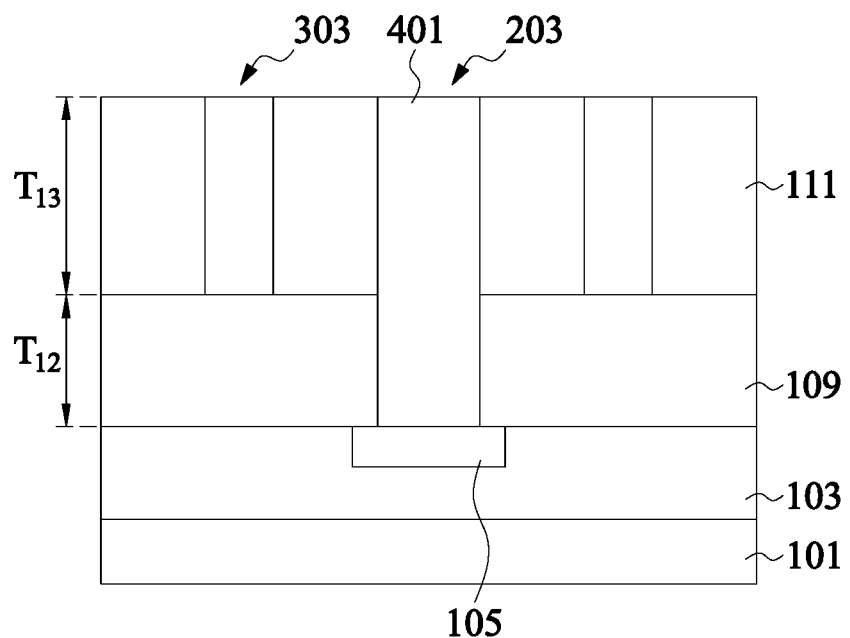
FIG. 8 illustrates an embodiment which includes the first dielectric layer and the insert layer and in which the second openings extend through the insert layer in accordance with some embodiments.

FIG. 8 illustrates another embodiment in which the insert layer 109, instead of being placed between the first dielectric layer 107 and the second dielectric layer 111, replaces the second dielectric layer 111 such that the second dielectric layer 111 is not used. In this embodiment the first dielectric layer 107 may be formed with a twelfth thickness $T_{12}$ of between about 100 Å and about 600 Å, such as about 400 Å, and the insert layer 109 may be formed to have an thirteenth thickness $T_{13}$ of between about 100 Å and about 700 Å, such as about 500 Å. Additionally, in this embodiment the second etching process 305 may be used to form the second openings 303 to extend all of the way through the insert layer 109 but will not extend into the first dielectric layer 107. Rather, the second openings 303 will stop at or only marginally extend into the first dielectric layer 107. Once formed, the first opening 203 and the second openings 303 may be filled with conductive material to form the interconnects 401, as described above with respect to FIG. 4.

Figure 9:
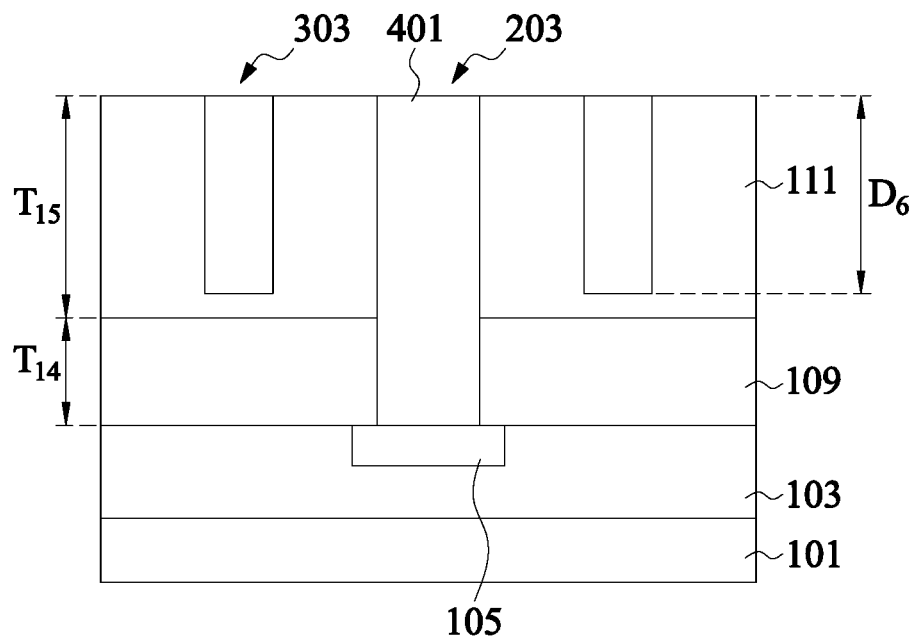
FIG. 9 illustrates an embodiment which includes the first dielectric layer and the insert layer and in which the second openings extend partially into the insert layer in accordance with some embodiments.

FIG. 9 illustrates yet another embodiment in which the insert layer 109, instead of being placed between the first dielectric layer 107 and the second dielectric layer 111, replaces the second dielectric layer 111 such that the second dielectric layer 111 is not used. In this embodiment the first dielectric layer 107 may be formed with a fourteenth thickness $T_{14}$ of between about 100 Å and about 500 Å, such as about 300 Å, and the insert layer 109 may be formed to have an fifteenth thickness $T_{15}$ of between about 100 Å and about 700 Å, such as about 500 Å. In this embodiment the second etching process 305 may be used to form the second openings 303 will extend partially through the insert layer 109 but will not extend all of the way through the insert layer 109 and will not extend into the first dielectric layer 107. In an embodiment the second openings 303 will extend into the insert layer 109 a sixth depth $D_6$ of between about 100 Å and about 700 Å, such as about 400 Å. Once formed, the first opening 203 and the second openings 303 may be filled with conductive material to form the interconnects 401, as described above with respect to FIG. 4.

Figure 10:
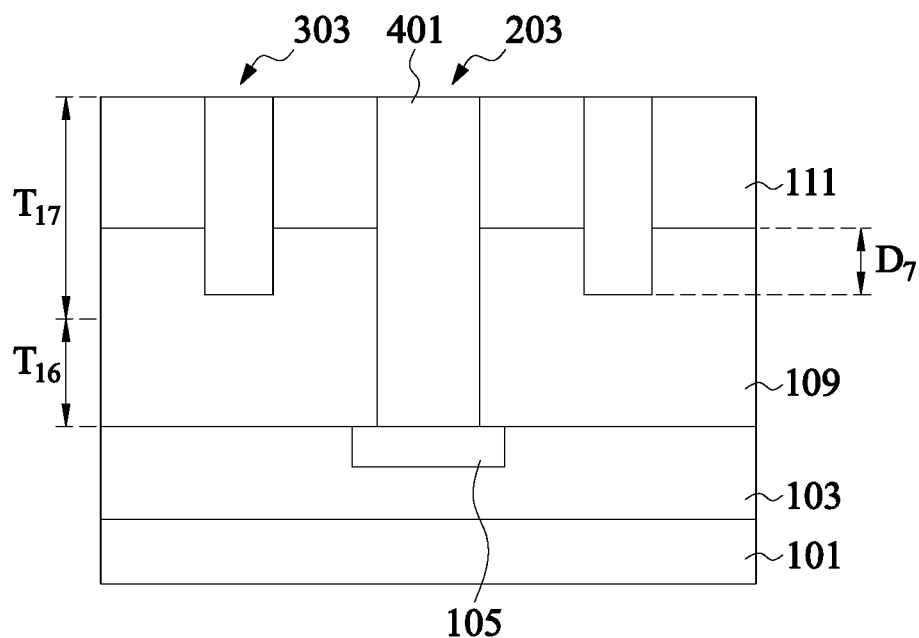
FIG. 10 illustrates an embodiment which includes the second dielectric layer and the insert layer and in which the second openings extend into the insert layer in accordance with some embodiments.

FIG. 10 illustrates an embodiment in which, instead of replacing the second dielectric layer 111, the insert layer 109 replaces the first dielectric layer 107, such that the insert layer 109 is formed directly on the metallization layers 103. In this embodiment the insert layer 109 may be formed to have a sixteenth thickness $T_{16}$ of between about 100 Å and about 700 Å, such as about 500 Å. Additionally, the second dielectric layer 111 may be formed over the insert layer 109 and have a seventeenth thickness $T_{17}$ of between about 100 Å and about 500 Å, such as about 300 Å. In this embodiment the second etching process 305 may be used to form the second openings 303 to extend completely through the second dielectric layer 111 and extend partially through the insert layer 109. In an embodiment the second openings 303 extend into the insert layer 109 a seventh depth $D_7$ of less than about 300 Å, such as about 100 Å. Once formed, the first opening 203 and the second openings 303 may be filled with conductive material to form the interconnects 401, as described above with respect to FIG. 4.

Figure 11:
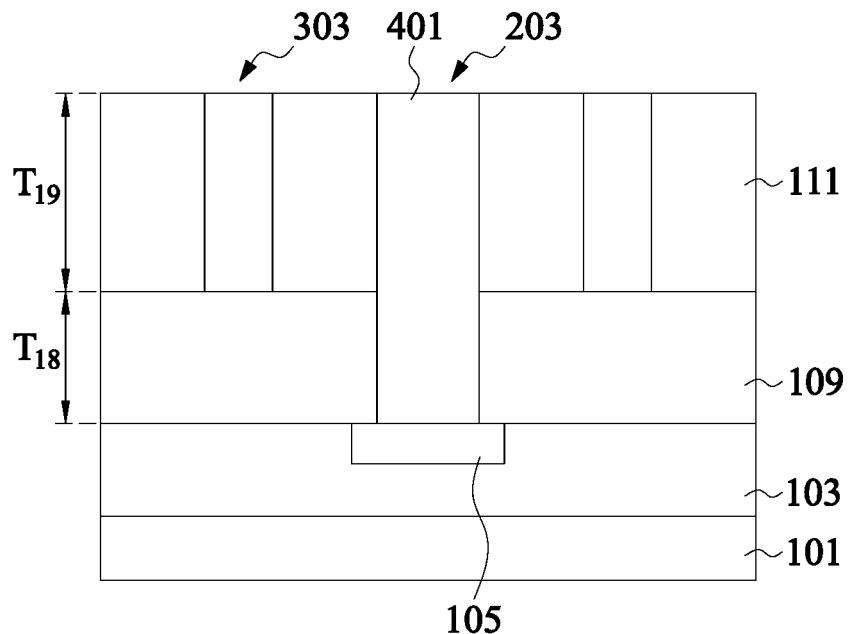
FIG. 11 illustrates an embodiment which includes the second dielectric layer and the insert layer and in which the second openings extend through the second dielectric layer in accordance with some embodiments.

FIG. 11 illustrates another embodiment in which, instead of replacing the second dielectric layer 111, the insert layer 109 replaces the first dielectric layer 107, such that the insert layer 109 is formed directly on the metallization layers 103. In this embodiment the insert layer 109 may be formed to have an eighteenth thickness $T_{18}$ of between about 100 Å and about 600 Å, such as about 400 Å. Additionally, the second dielectric layer 111 may be formed over the insert layer 109 and have a nineteenth thickness $T_{19}$ of between about 100 Å and about 700 Å, such as about 500 Å. In this embodiment the second etching process 305 may be used to form the second openings 303 to extend completely through the second dielectric layer 111 but to not extend, or only marginally extend, into the insert layer 109. Once formed, the first opening 203 and the second openings 303 may be filled with conductive material to form the interconnects 401, as described above with respect to FIG. 4.

Figure 12:
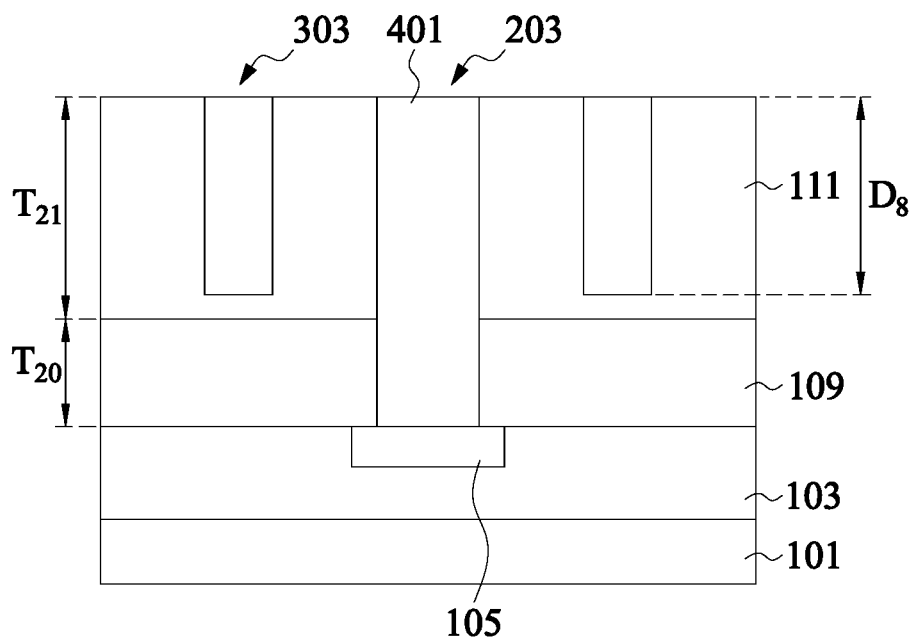
FIG. 12 illustrates an embodiment which includes the second dielectric layer and the insert layer and in which the second openings extend partially through the second dielectric layer in accordance with some embodiments.

FIG. 12 illustrates yet another embodiment in which, instead of replacing the second dielectric layer 111, the insert layer 109 replaces the first dielectric layer 107, such that the insert layer 109 is formed directly on the metallization layers 103. In this embodiment the insert layer 109 may be formed to have a twentieth thickness $T_{20}$ of between about 100 Å and about 500 Å, such as about 300 Å. Additionally, the second dielectric layer 111 may be formed over the insert layer 109 and have a twenty-first thickness $T_{21}$ of between about 100 Å and about 700 Å, such as about 500 Å. In this embodiment the second etching process 305 may be used to form the second openings 303 to extend partially through the second dielectric layer 111 but not extend all of the way through the second dielectric layer 111. In an embodiment the second openings 303 extend into the second dielectric layer an eighth depth $D_8$ of between about 100 Å and about 700 Å, such as about 400 Å. Once formed, the first opening 203 and the second openings 303 may be filled with conductive material to form the interconnects 401, as described above with respect to FIG. 4.

By providing the insert layer as a frame for additional structural support, the normally weaker porous material of the first dielectric layer 107 and second dielectric layer 111 may be supported. Such additional support helps to reduce variances between different trenches that may be caused by their proximity (or lack of proximity) to a via etch process or via opening. This prevents complications that could arise during subsequent gap-filling processes.

Figure 13:
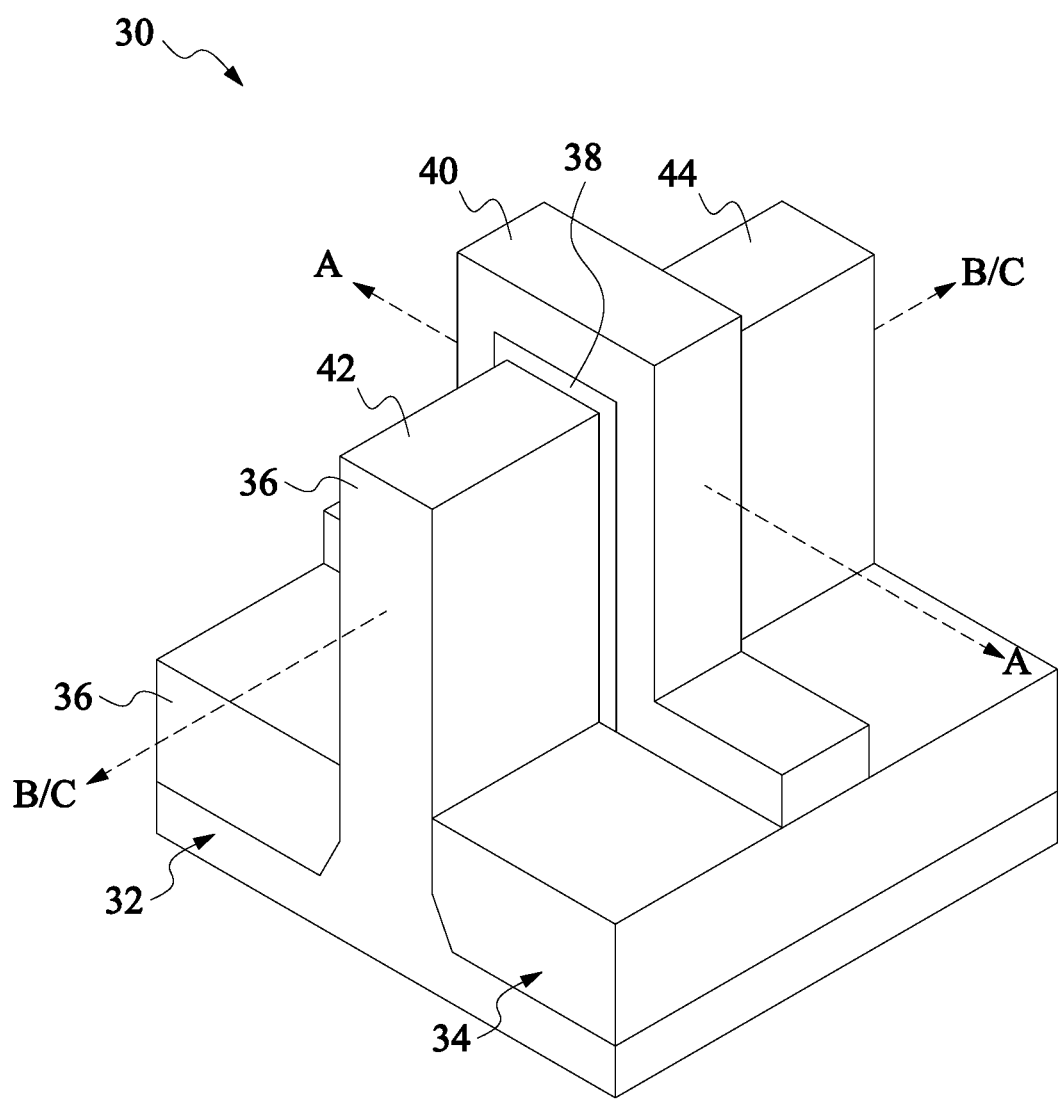

FIG. 13 illustrates an example of a fin field-effect transistor (FinFET) 30 in a three-dimensional view that may be used in some embodiments. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 13 further illustrates reference cross-sections that are used in later figures. Cross-section A-A is across a channel, gate dielectric 38, and gate electrode 40 of the FinFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 14 through 27C are cross-sectional views of intermediate stages in the manufacturing of FinFETs along with the use of the insert layer 109 in accordance with an exemplary embodiment. FIGS. 14 through 18 illustrate reference cross-section A-A illustrated in FIG. 13, except for multiple FinFETs. In FIGS. 19A through 27C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 14:
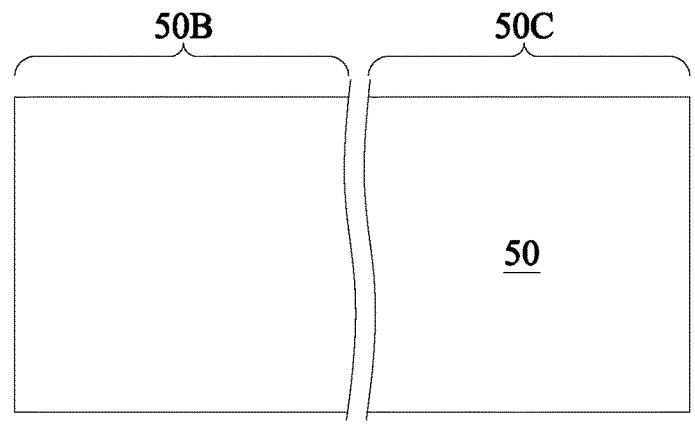

FIG. 14 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 15:
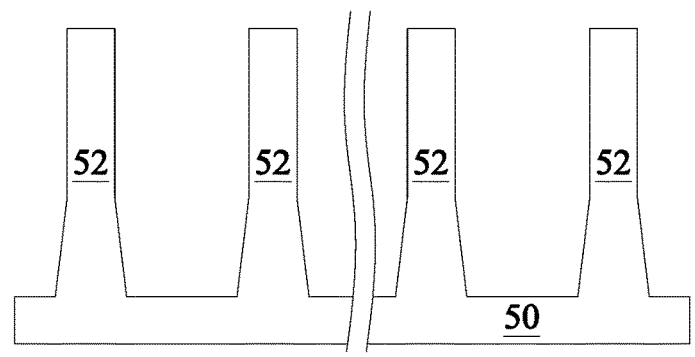
Figure 16:
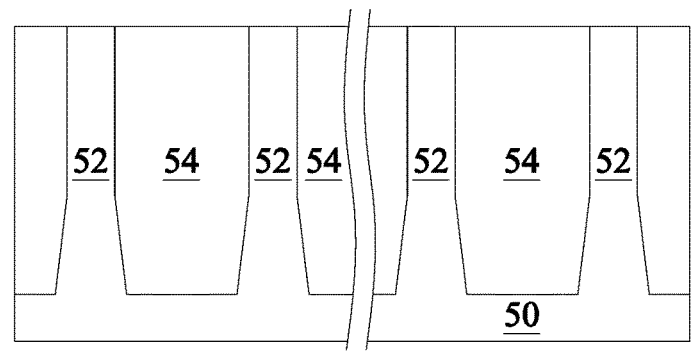

FIGS. 15 and 16 illustrate the formation of fins 52 and isolation regions 54 between neighboring fins 52. In FIG. 15 fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 16 an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, the insulation material 54 is silicon oxide formed by a FCVD process. The insulating material 54 may be referred to as isolation regions 54. Further in FIG. 5 and in step 204, a planarization process, such as a chemical mechanical polish (CMP), may remove any excess insulation material 54 and form top surfaces of the isolation regions 54 and top surfaces of the fins 52 that are coplanar.

Figure 17:
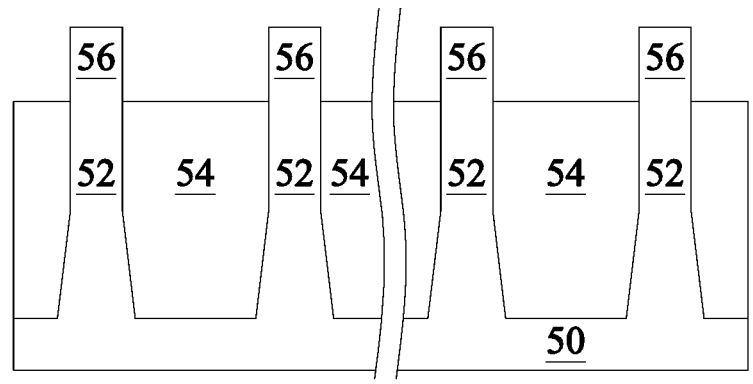

FIG. 17 illustrates the recessing of the isolation regions 54 to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 15 through 17 is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 16 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 17, appropriate wells may be formed in the fins 56, the fins 52, and/or the substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region, such as the PMOS region. The p-type impurities may be boron, $BF_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 50B and the second region 50C, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 18:
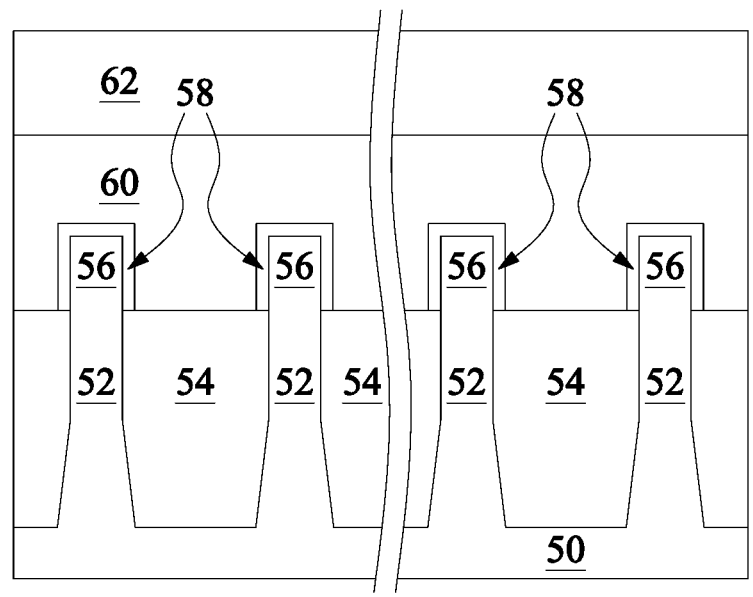

In FIG. 18, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

In FIGS. 19A, 19B, and 19C, the mask layer 62 may be patterned using acceptable photolithography and etching techniques to form masks 72 in the first region 50B (as illustrated in FIG. 19B) and masks 78 in the second region 50C (as illustrated in FIG. 19C). The pattern of the masks 72 and 78 then may be transferred to the dummy gate layer 60 and dummy dielectric layer 58 by an acceptable etching technique to form dummy gates 70 in the first region 50B and dummy gates 76 in the second region 50C. The dummy gates 70 and 76 cover respective channel regions of the fins 56. The dummy gates 70 and 76 may also have a lengthwise direction substantially perpendicular to the lengthwise direction of respective epitaxial fins.

Figure 20A:
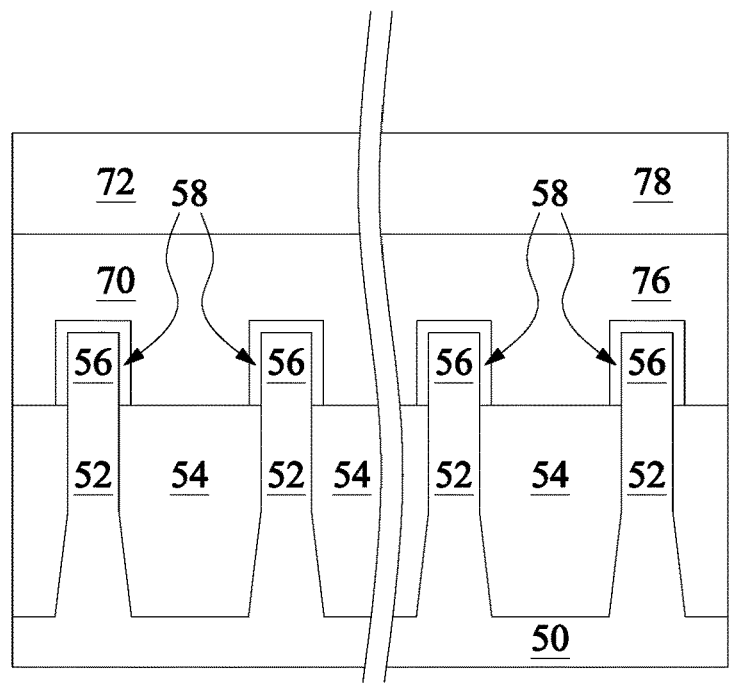
Figure 20B:
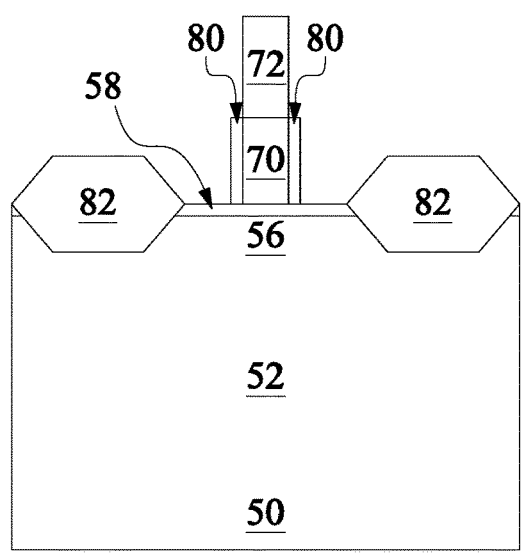
Figure 20C:
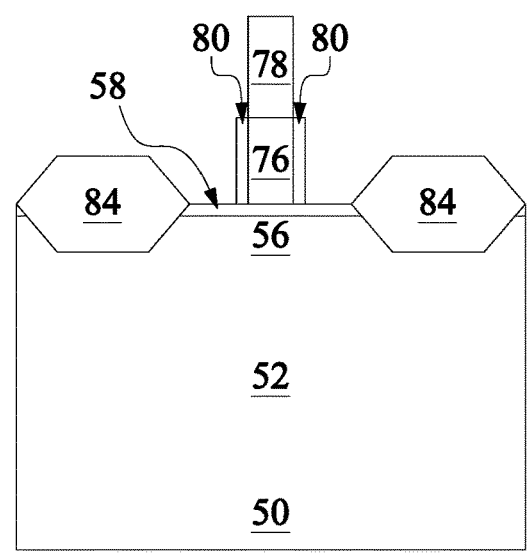

In FIGS. 20A, 20B, and 20C, gate seal spacers 80 can be formed on exposed surfaces of respective dummy gates 70 and 76 and/or fins 56. A thermal oxidation or a deposition followed by an anisotropic etch may form the gate seal spacers 80.

After the formation of the gate seal spacers 80, implants for lightly doped source/drain (LDD) regions may be performed. Similar to the implants discussed above in FIG. 17, a mask, such as a photoresist, may be formed over the first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over the second region 50C while exposing the first region 50B, and n-type impurities may be implanted into the exposed fins 56 in the first region 50B. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 20A, 20B, and 20C, epitaxial source/drain regions 82 and 84 are formed in the fins 56. In the first region 50B, epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52. In the second region 50C, epitaxial source/drain regions 84 are formed in the fins 56 such that each dummy gate 76 is disposed between respective neighboring pairs of the epitaxial source/drain regions 84. In some embodiments that epitaxial source/drain regions 84 may extend into the fins 52.

Epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

Epitaxial source/drain regions 84 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 76 and/or gate seal spacers 80 in the second region 50C. Then, source/drain regions of the epitaxial fins in the second region 50C are etched to form recesses. The epitaxial source/drain regions 84 in the second region 50C are epitaxially grown in the recesses. The epitaxial source/drain regions 84 may include any acceptable material, such as appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. Subsequently, the dummy gate spacers in the second region 50C are removed, for example, by an etch, as is the mask on the first region 50B.

Figure 21A:
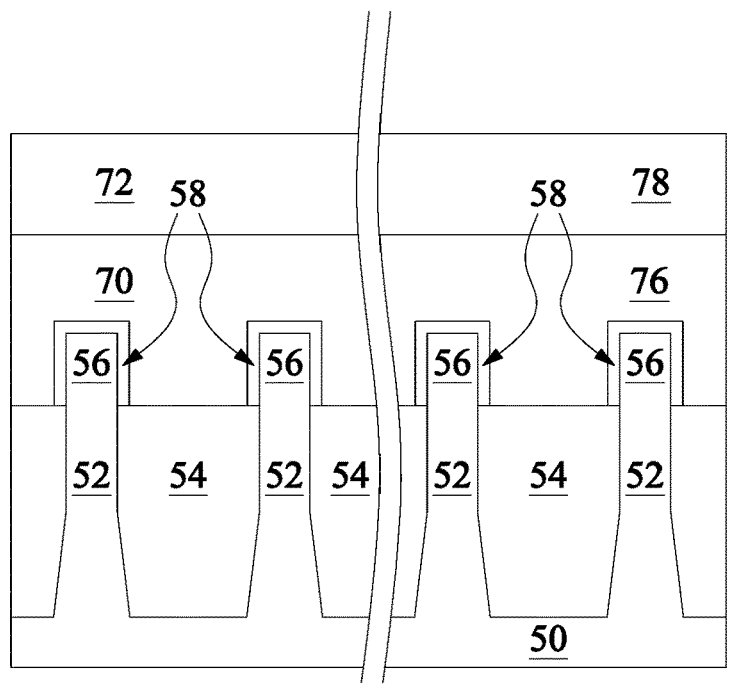
Figure 21B:
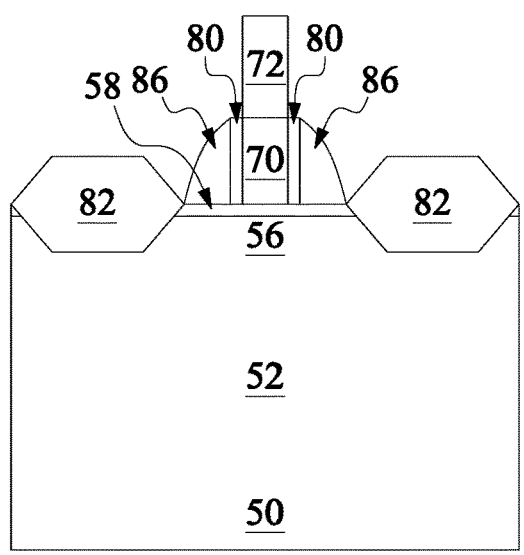
Figure 21C:
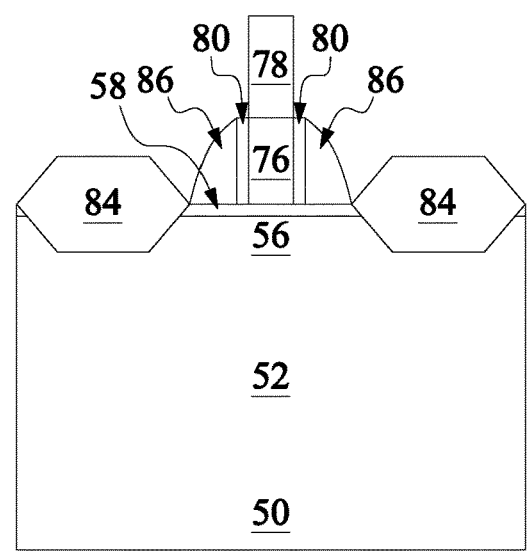

In FIGS. 21A, 21B, and 21C, gate spacers 86 are formed on the gate seal spacers 80 along sidewalls of the dummy gates 70 and 76. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 82 and 84 may be in situ doped during growth.

In FIGS. 22A, 22B, and 22C, an ILD 88 is deposited over the structure illustrated in FIGS. 21A, 21B, and 21C. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 23A:
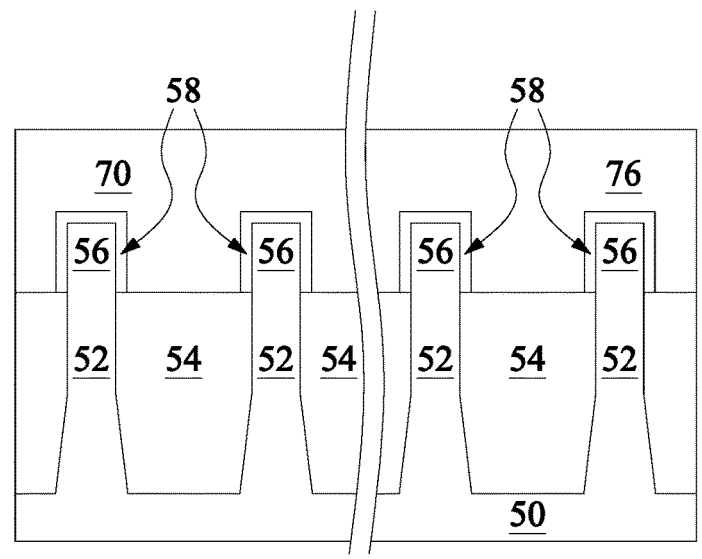
Figure 23B:
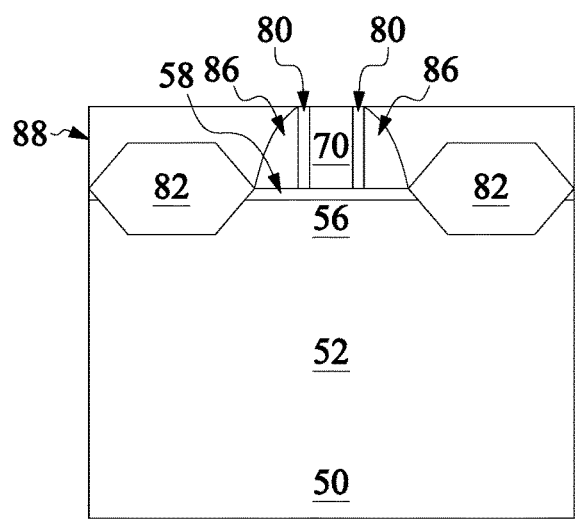
Figure 23C:
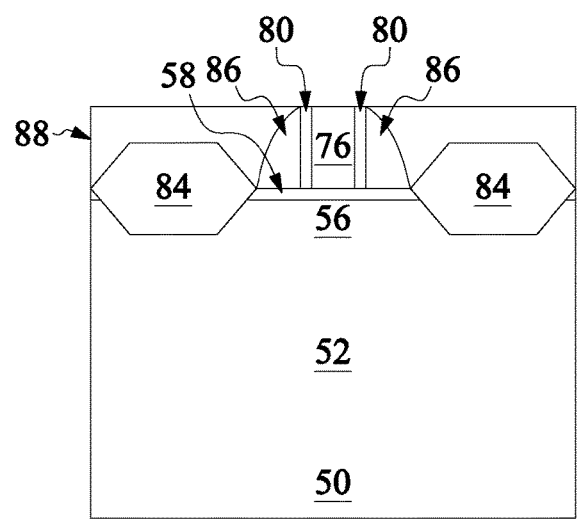

In FIGS. 23A, 23B, and 23C, a planarization process, such as a CMP, may be performed to level the top surface of the ILD 88 with the top surfaces of the dummy gates 70 and 76. The CMP may also remove the masks 72 and 78 on the dummy gates 70 and 76. Accordingly, top surfaces of the dummy gates 70 and 76 are exposed through the ILD 88.

In FIGS. 24A, 24B, and 24C, the dummy gates 70 and 76, gate seal spacers 80, and portions of the dummy dielectric layer 58 directly underlying the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 and gate seal spacers 80 may then be removed after the removal of the dummy gates 70 and 76.

In FIGS. 25A, 25B, and 25C, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. After the filling of gate electrodes 94 and 98, in step 228, a planarization process, such as a CMP, may be performed to remove the excess portions of gate dielectric layers 92 and 96 and the material of gate electrodes 94 and 98, which excess portions are over the top surface of the ILD 88. The resulting remaining portions of material of gate electrodes 94 and 98 and gate dielectric layers 92 and 96 thus form replacement gates of the resulting FinFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 26A:
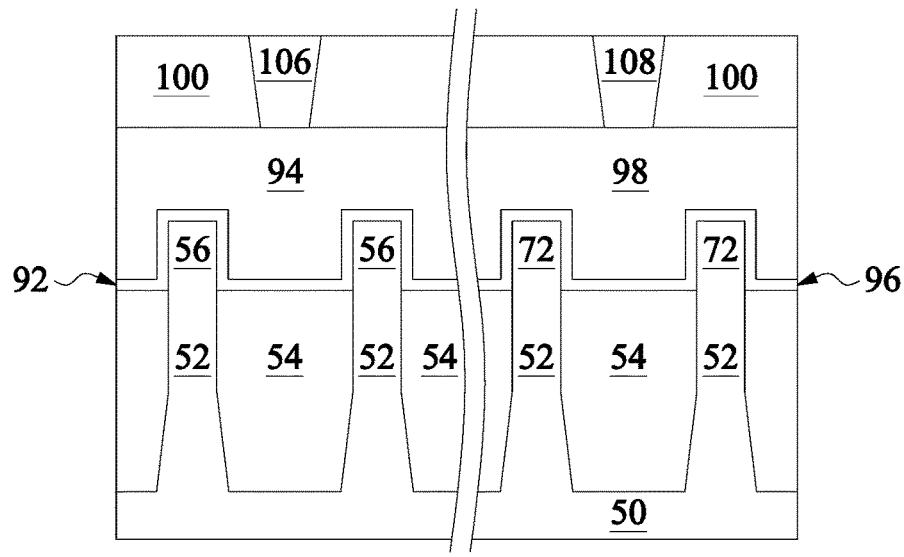
Figure 26B:
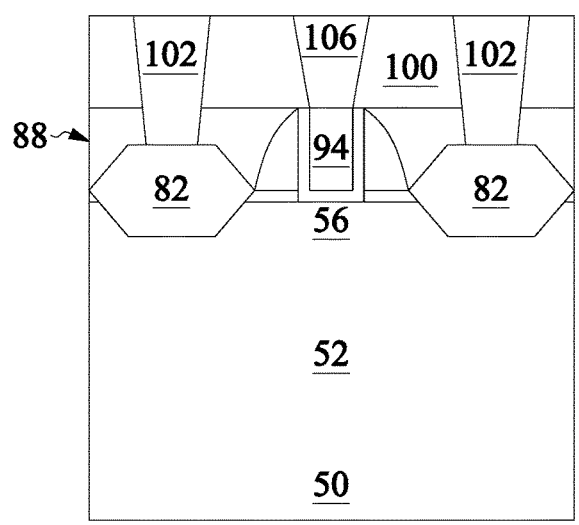
Figure 26C:
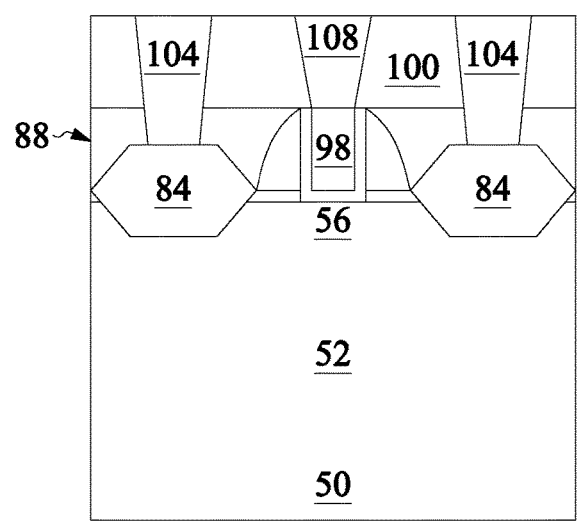

In FIGS. 26A, 26B, and 26C, an ILD 100 is deposited over the ILD 88. Further illustrated in FIGS. 26A, 26B, and 26C, contacts 102 and 104 are formed through ILD 100 and ILD 88 and contacts 106 and 108 are formed through ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for contacts 102 and 104 are formed through the ILDs 88 and 100. Openings for contacts 106 and 108 are formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form contacts 102 and 104 in the openings. An anneal process may be performed to form a silicide at the interface between the epitaxial source/drain regions 82 and 84 and the contacts 102 and 104, respectively. Contacts 102 are physically and electrically coupled to the epitaxial source/drain regions 82, contacts 104 are physically and electrically coupled to the epitaxial source/drain regions 84, contact 106 is physically and electrically coupled to the gate electrode 94, and contact 108 is physically and electrically coupled to the gate electrode 98.

Figure 27A:
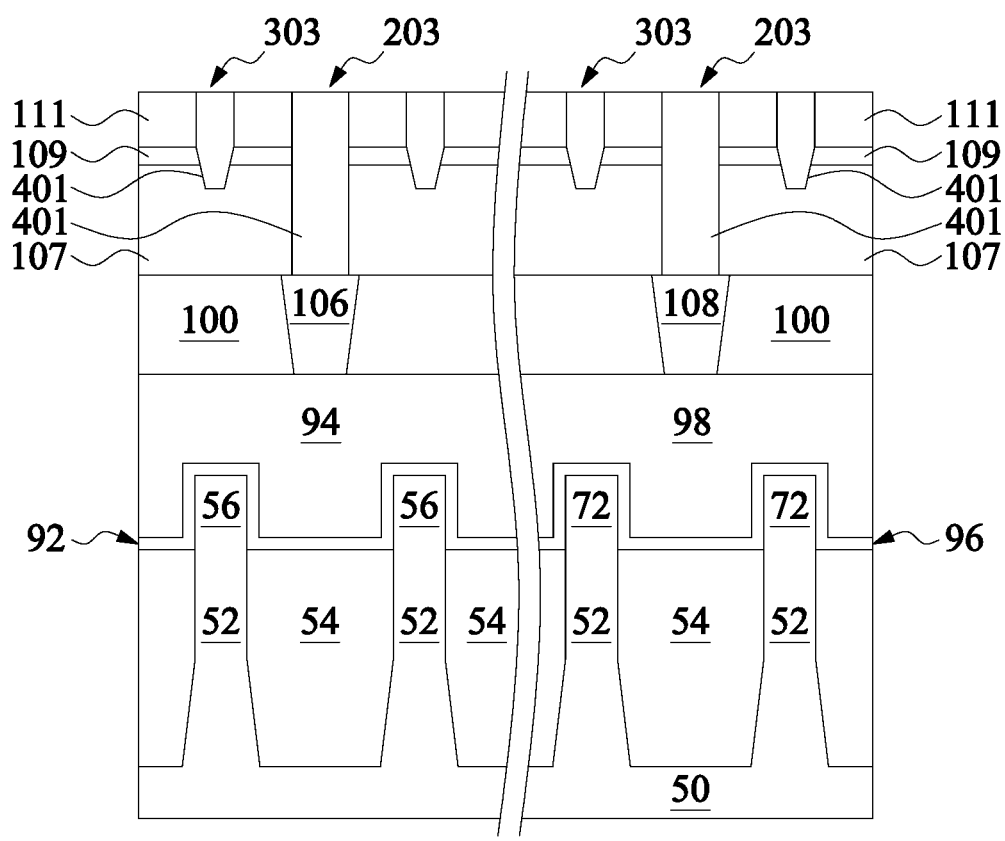
Figure 27B:
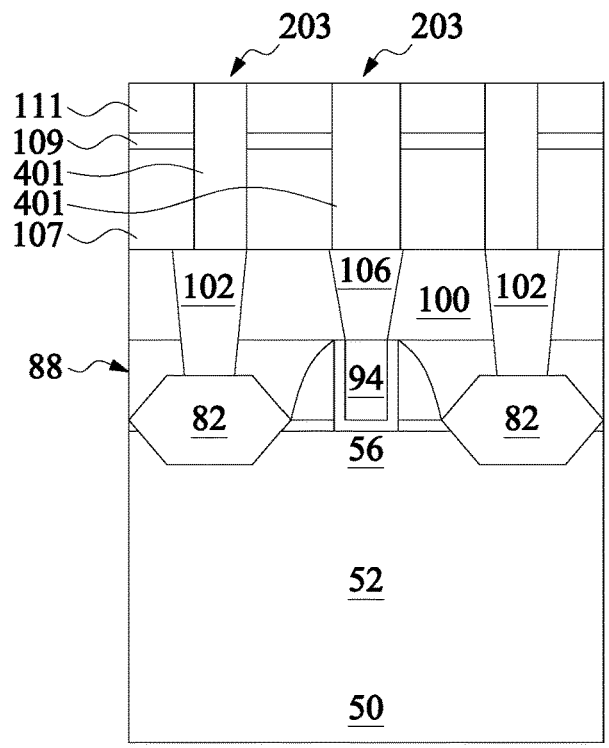
Figure 27C:
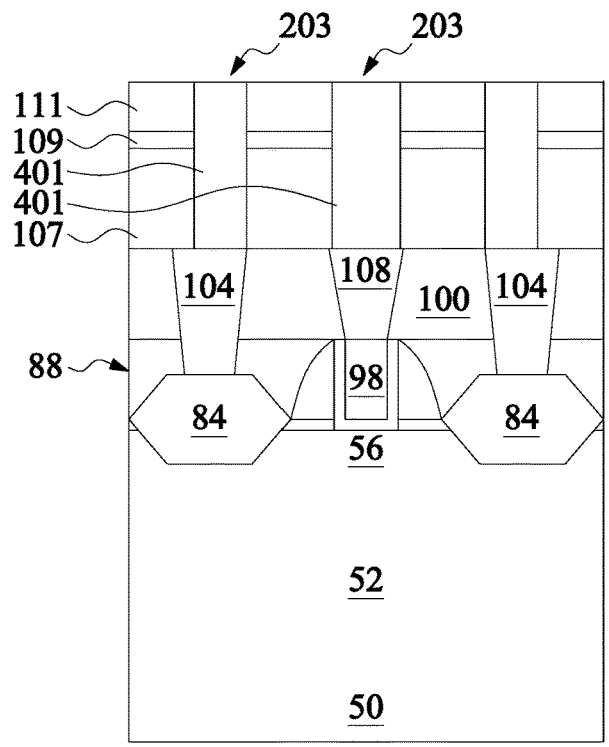

In FIGS. 27A, 27B, and 27C, the first dielectric layer 107, the insert layer 109, and the second dielectric layer 111 may be formed over the ILD 100. Once the first dielectric layer 107, the insert layer 109, and the second dielectric layer 111 have been formed, the first opening 203, and the second openings 303 may be formed through the first dielectric layer 107, the insert layer 109, and the second dielectric layer 111 and then filled with conductive material in order to form the interconnects 401 to the contact 106, to the contacts 108, to the contacts 102, and to the contacts 104. In an embodiment the formation of the interconnects 401 within the first dielectric layer 107, an insert layer 109, and a second dielectric layer 111 may be performed as described above with respect to FIGS. 1-4. However, any suitable processes or materials may be utilized to form the interconnects 401.

Additionally, while the embodiments described in FIGS. 13-27C have been described with respect to the first dielectric layer 107, an insert layer 109, and a second dielectric layer 111 and the interconnects 401 as described above with respect to FIGS. 1-4, the embodiments are not intended to be limited to the embodiments described within FIGS. 1-4. Rather, any of the embodiments described above with respect to FIGS. 1-12 may be utilized, and all such embodiments are fully intended to be included within the scope of the embodiments.

Further, although not explicitly shown, a person having ordinary skill in the art will readily understand that further processing steps may be performed on the structure in FIGS. 27A, 27B, and 27C. For example, various IMDs and their corresponding metallizations may be formed over the structure, and external connections may be formed in order to provide electrical connectivity to the structure.

By utilizing the first dielectric layer 107, the insert layer 109, and the second dielectric layer 111 as described herein with the structure for finFETs, additional support for the structure including finFETs may be obtained. Such additional support helps to reduce variances between the different trenches that may be caused by their proximity (or lack of proximity) to a via etch process or via opening process, and helps to prevent complications that could arise during subsequent gap-filling processes. As such, a more sturdy structure with fewer defects may be created for a finFET device.

In accordance with an embodiment, a semiconductor device comprising a first dielectric layer over a substrate is provided. A second dielectric layer is in physical contact with the first dielectric layer, wherein the first dielectric layer and the second dielectric layer form a composite dielectric layer and wherein the second dielectric layer has a larger hardness than the first dielectric layer; and a first opening extends into the composite dielectric layer, the first opening having an angle of between about 70° to about 80°.

In accordance with another embodiment, a semiconductor device comprising a first dielectric layer over a substrate, the first dielectric layer comprising a first dielectric material is provided. An insert layer is over and in contact with the first dielectric layer, the insert layer comprising a second dielectric material with a larger hardness and a larger K-value than the first dielectric material. A second dielectric layer is over and in contact with the insert layer, the second dielectric layer comprising a third dielectric material with a smaller hardness and smaller K-value than the second dielectric material. A trench opening is located in the second dielectric layer, the trench opening having a trench profile angle of between about 70° and about 80° and a via opening is located in the second dielectric layer, the via opening having a via profile angle of between about 60° and about 70°.

In accordance with yet another embodiment, a method of manufacturing a semiconductor device, the method comprising depositing a first dielectric layer over a conductive element within a substrate. The first dielectric layer is supported by depositing an insert layer over and in physical contact with the first dielectric layer, wherein the insert layer has a hardness that is greater than the first dielectric layer and a K-value that is greater than the first dielectric layer. A second dielectric layer is deposited over and in physical contact with the insert layer, wherein the second dielectric layer has a hardness that is less than the insert layer and has a K-value that is less than the insert layer. The second dielectric layer, the insert layer, and the first dielectric layer are etched to form a via opening, wherein the via opening has a via profile angle of between about 60° and about 70°, and the second dielectric layer is etched to form a trench opening at least partially into the second dielectric layer, wherein the trench opening has a trench profile angle of between about 70° and about 80°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first dielectric layer over a substrate, the first dielectric layer comprising a first dielectric material;
    an insert layer over and in contact with the first dielectric layer, the insert layer comprising a second dielectric material with a larger hardness and a larger K-value than the first dielectric material;
    a second dielectric layer over and in contact with the insert layer, the second dielectric layer comprising a third dielectric material with a smaller hardness and smaller K-value than the second dielectric material;
    a trench opening located in the second dielectric layer, the trench opening having a trench profile angle of between about 70° and about 80°; and
    a via opening located in the second dielectric layer, the via opening having a via profile angle of between about 60° and about 70°.

2. The semiconductor device of claim 1, wherein the trench opening extends into the first dielectric layer.

3. The semiconductor device of claim 2, wherein the trench opening extends into the first dielectric layer a distance of less than about 200 Å.

4. The semiconductor device of claim 1, wherein the trench opening does not extend into the insert layer.

5. The semiconductor device of claim 1, wherein the trench opening extends only partially into the insert layer.

6. The semiconductor device of claim 5, wherein the trench opening extends into the insert layer a distance of less than about 100 ÅA.

7. The semiconductor device of claim 1, wherein the insert layer has a thickness of between about 10 Å and about 100 Å, wherein the substrate comprises a fin.

8. A semiconductor device comprising:
    a first dielectric layer over a substrate;
    an insert dielectric layer in physical contact with the first dielectric layer, wherein the first dielectric layer and the insert dielectric layer form a composite dielectric layer and wherein the insert dielectric layer has a larger hardness than the first dielectric layer;
    a second dielectric layer over and in contact with the insert dielectric layer, the second dielectric layer having a smaller hardness and smaller K-value than the insert dielectric layer;
    a first opening extending into the composite dielectric layer, the first opening having an angle of between about 70° to 80°; and
    a via opening extending into the composite dielectric layer, wherein the via opening has a via profile angle of between about 60° and about 70°.

9. The semiconductor device of claim 8, wherein the first opening is a trench opening, wherein the trench opening extends into the insert dielectric layer.

10. The semiconductor device of claim 8, wherein the second dielectric layer has a hardness of at least 5 GPa greater than the first dielectric layer.

11. The semiconductor device of claim 8, wherein the second dielectric layer has a K-value of greater than about 3.0.

12. The semiconductor device of claim 8, wherein the substrate further comprises a fin.

13. The semiconductor device of claim 8, wherein the first opening is separated from a second opening by a length of less than about 200 nm.

14. A semiconductor device comprising:
    a first dielectric layer over a conductive element within a substrate;
    an insert layer over and in physical contact with the first dielectric layer, wherein the insert layer has a hardness that is greater than the first dielectric layer and a K-value that is greater than the first dielectric layer;
    a second dielectric layer over and in physical contact with the insert layer, wherein the second dielectric layer has a hardness that is less than the insert layer and has a K-value that is less than the insert layer;
    a via opening through the second dielectric layer, the insert layer, and the first dielectric layer, wherein the via opening has a via profile angle of between about 60° and about 70°; and
    a trench opening extending at least partially into the second dielectric layer, wherein the trench opening has a trench profile angle of between about 70° and about 80°.

15. The semiconductor device of claim 14, wherein the etching the second dielectric layer forms the trench opening without exposing the insert layer.

16. The semiconductor device of claim 14, wherein the trench opening extends at least partially into the insert layer.

17. The semiconductor device of claim 16, wherein the trench opening extends at least partially into the first dielectric layer.

18. The semiconductor device of claim 14, wherein the insert layer comprises a metal nitride.

19. The semiconductor device of claim 14, wherein the substrate comprises fins.

20. The semiconductor device of claim 8, wherein the first opening extends into the first dielectric layer a distance of less than about 200 Å.

* * * * *

UNITED STATES PATENT AND TRADEMARK OFFICE
CERTIFICATE OF CORRECTION

PATENT NO. : 10,727,350 B2
APPLICATION NO. : 16/047624
DATED : July 28, 2020
INVENTOR(S) : Chang et al.

Page 1 of 1

It is certified that error appears in the above-identified patent and that said Letters Patent is hereby corrected as shown below:

In the Claims

In Column 20, Line 21, Claim 8, delete "about 70° to 80°" and insert --about 70° to about 80°--.

Signed and Sealed this
Tenth Day of November, 2020

Andrei Iancu
*Director of the United States Patent and Trademark Office*